United States Patent
Lu et al.

(10) Patent No.: US 11,404,444 B2
(45) Date of Patent: Aug. 2, 2022

(54) THREE-DIMENSIONAL MEMORY DEVICE AND METHODS OF FORMING

(71) Applicant: Taiwan Semiconductor Manufacturing Co., Ltd., Hsinchu (TW)

(72) Inventors: Chun-Chieh Lu, Taipei (TW); Sai-Hooi Yeong, Zhubei (TW); Bo-Feng Young, Taipei (TW); Yu-Ming Lin, Hsinchu (TW); Han-Jong Chia, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 88 days.

(21) Appl. No.: 17/070,619

(22) Filed: Oct. 14, 2020

(65) Prior Publication Data

US 2021/0375940 A1    Dec. 2, 2021

Related U.S. Application Data

(60) Provisional application No. 63/031,713, filed on May 29, 2020.

(51) Int. Cl.
*H01L 27/12* (2006.01)
*H01L 21/84* (2006.01)

(52) U.S. Cl.
CPC .......... *H01L 27/1203* (2013.01); *H01L 21/84* (2013.01); *H01L 27/1207* (2013.01); *H01L 27/1211* (2013.01)

(58) Field of Classification Search
CPC . H01L 27/1203; H01L 21/24; H01L 27/0688; H01L 27/11502; H01L 27/1207; H01L 27/1211; H01L 27/11597; H01L 27/1159
USPC .............................................. 438/4; 257/295
See application file for complete search history.

(56) References Cited

U.S. PATENT DOCUMENTS

| | | | |
|---|---|---|---|
| 9,362,487 B2 | 6/2016 | Inumiya et al. | |
| 9,941,299 B1 * | 4/2018 | Chen et al. | ....... H01L 27/11597 365/130 |
| 10,211,223 B2 | 2/2019 | Van Houdt et al. | |
| 2016/0027490 A1 | 1/2016 | Muller | |

(Continued)

FOREIGN PATENT DOCUMENTS

TW    201937494 A    9/2019

*Primary Examiner* — Thinh T Nguyen
(74) *Attorney, Agent, or Firm* — Slater Matsil, LLP

(57) ABSTRACT

A method for forming a memory device includes: forming a first layer stack and a second layer stack successively over a substrate, wherein each of the first and the second layer stacks comprises a dielectric layer, a channel layer, and a source/drain layer formed successively over the substrate; forming openings that extends through the first layer stack and the second layer stack, where the openings includes first openings within boundaries of the first and the second layer stacks, and a second opening extending from a sidewall of the second layer stack toward the first openings; forming inner spacers by replacing portions of the source/drain layer exposed by the openings with a dielectric material; lining sidewalls of the openings with a ferroelectric material; and forming first gate electrodes in the first openings and a dummy gate electrode in the second opening by filling the openings with an electrically conductive material.

20 Claims, 22 Drawing Sheets

(56) References Cited

U.S. PATENT DOCUMENTS

2016/0118404 A1    4/2016   Peng
2020/0357454 A1   11/2020   Derner et al.

* cited by examiner

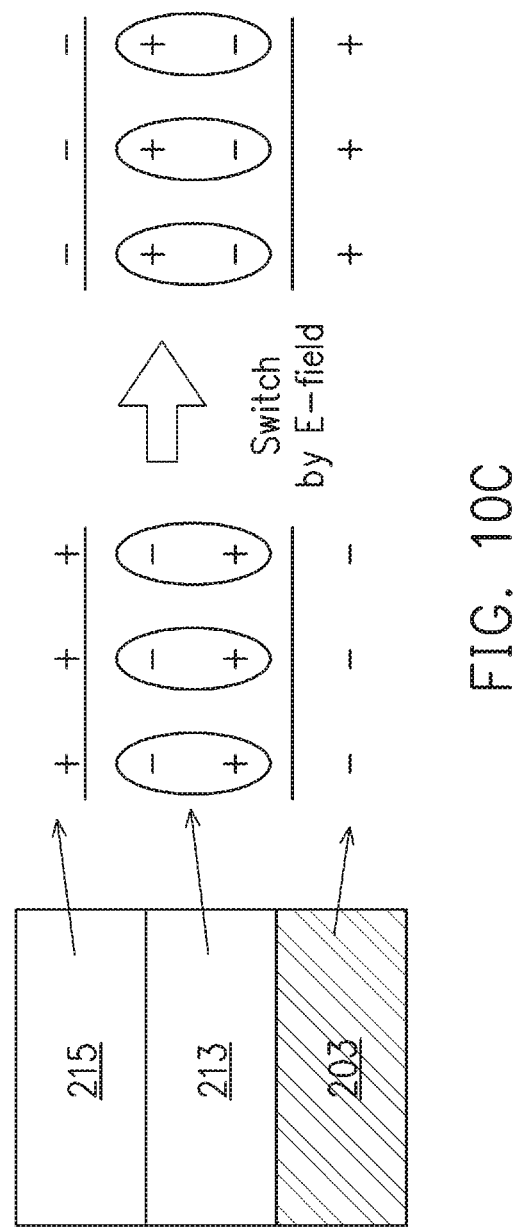

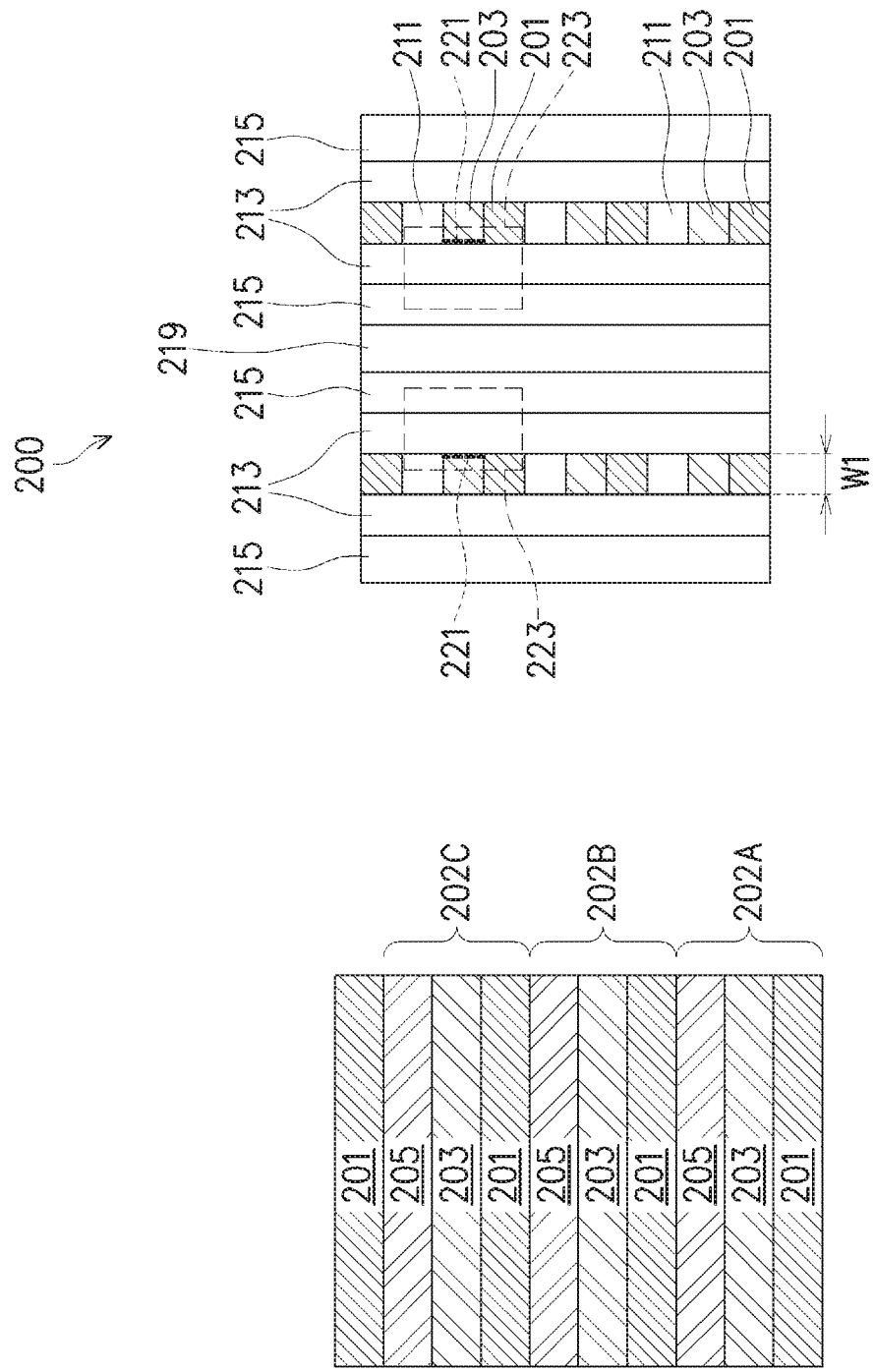

THREE-DIMENSIONAL MEMORY DEVICE AND METHODS OF FORMING

PRIORITY CLAIM AND CROSS-REFERENCE

This application claims the benefit of U.S. Provisional Application No. 63/031,713, filed on May 29, 2020, which application is hereby incorporated herein by reference.

TECHNICAL FIELD

The present invention relates generally to semiconductor memory devices, and, in particular embodiments, to three-dimensional memory devices with ferroelectric material.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2-9, 10A, 10B, 10D, 10E, 10F, 10G, 10H, 11, and 12 illustrate various views of a three-dimensional memory device at various stages of manufacturing, in an embodiment;

FIG. 10C illustrates switching of the electrical polarization direction of the ferroelectric material of the three-dimensional memory device of FIG. 10B, in an embodiment;

DETAILED DESCRIPTION OF ILLUSTRATIVE EMBODIMENTS

Figure 1:
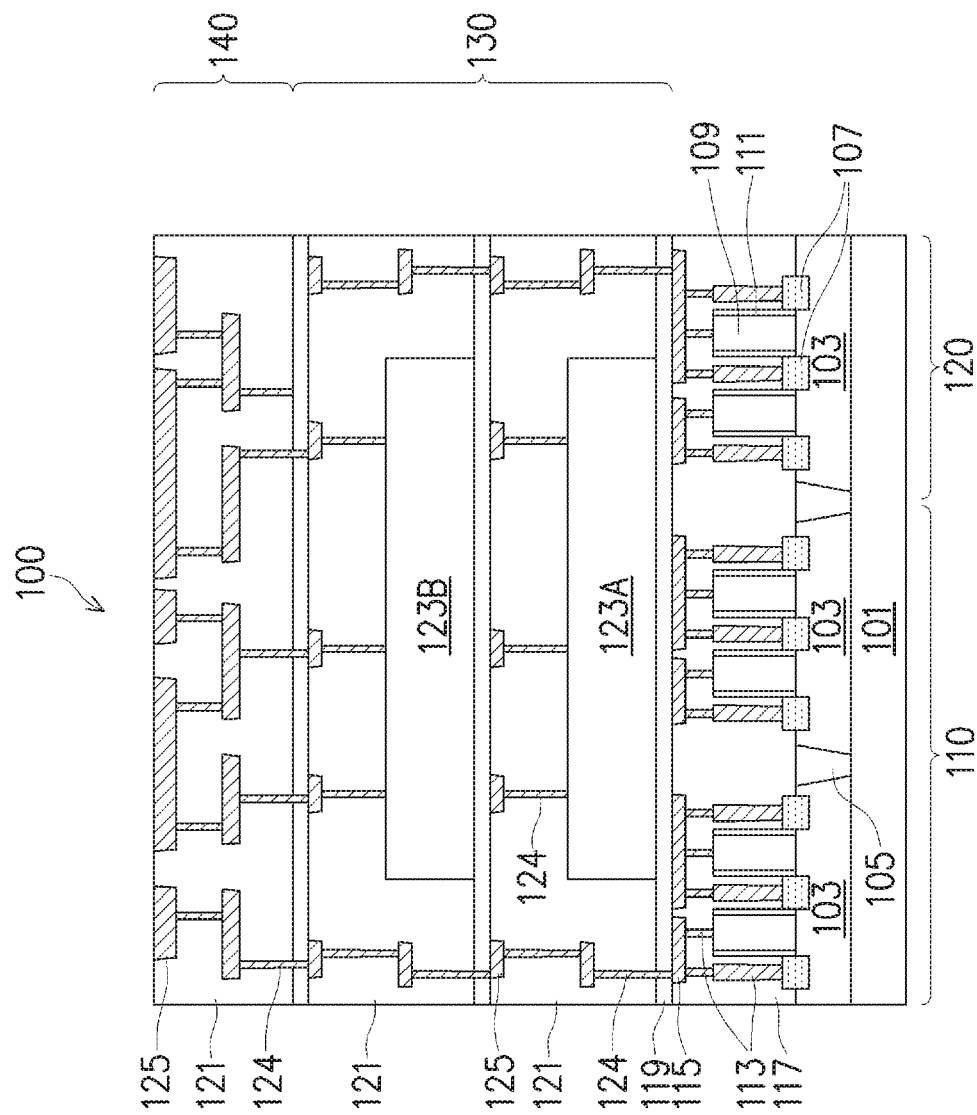
FIG. 1 illustrates a cross-sectional view of a semiconductor device with integrated memory devices, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar process using a same or similar material(s).

In some embodiments, a method for forming a memory device includes: forming a first layer stack and a second layer stack successively over a substrate, wherein each of the first and the second layer stacks comprises a dielectric layer, a channel layer, and a source/drain layer formed successively over the substrate; forming openings that extends through the first layer stack and the second layer stack, where the openings includes first openings within boundaries of the first and the second layer stacks, and a second opening extending from a sidewall of the second layer stack toward the first openings; forming inner spacers by replacing portions of the source/drain layer exposed by the openings with a dielectric material; lining sidewalls of the openings with a ferroelectric material; and forming first gate electrodes in the first openings and a dummy gate electrode in the second opening by filling the openings with an electrically conductive material.

FIG. 1 illustrates a cross-sectional view of a semiconductor device 100 with integrated memory devices 123 (e.g., 123A and 123B), in an embodiment. The semiconductor device 100 is a fin-field effect transistor (FinFET) device with three-dimensional (3D) memory devices 123 integrated in the back-end-of-line (BEOL) processing of semiconductor manufacturing, in the illustrated embodiment. To avoid clutter, details of the 3D memory devices 123 are not shown in FIG. 1, but are discussed hereinafter.

As illustrated in FIG. 1, the semiconductor device 100 includes different regions for forming different types of circuits. For example, the semiconductor device 100 may include a first region 110 for forming logic circuits, and may include a second region 120 for forming, e.g., peripheral circuits, input/output (I/O) circuits, electrostatic discharge (ESD) circuits, and/or analog circuits. Other regions for forming other types of circuits are possible and are fully intended to be included within the scope of the present disclosure.

The semiconductor device 100 includes a substrate 101. The substrate 101 may be a bulk substrate, such as a silicon substrate, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components, such as transistors, resistors, capacitors, inductors, diodes, or the like, are formed in or on the substrate 101 in the front-end-of-line (FEOL) processing of semiconductor manufacturing. In the example of FIG. 1, semiconductor fins 103 (also referred to as fins) are formed protruding above the substrate 101. Isolation regions 105, such as shallow-trench isolation (STI) regions, are formed between or around the semiconductor fins 103. Gate electrodes 109 are formed over the semiconductor fins 103. Gate spacers in are formed along sidewalls of the gate electrodes 109. Source/drain regions 107, such as epitaxial source/drain regions, are formed on opposing sides of the gate electrodes 109. Contacts 113, such as gate contacts and source/drain contacts, are formed over and electrically coupled to respective underlying electrically conductive features (e.g., gate electrodes 109 or source/drain regions 107). One or more dielectric layers 117, such as an inter-layer dielectric (ILD) layer, is formed over the substrate 101 and around the semiconductor fins 103 and the gate electrodes 109. Other electrically conductive features, such as conductive lines 115, may also be formed in the one or more dielectric layers 117. The FinFETs in FIG. 1 may be formed by any suitable method known or used in the art, details are not repeated here.

Still referring to FIG. 1, a dielectric layer 119, which may be an etch stop layer (ESL), is formed over the one or more dielectric layers 117. In an embodiment, the dielectric layer 119 is formed of silicon nitride using plasma-enhanced physical vapor deposition (PECVD), although other dielectric materials such as nitride, carbide, boride, combinations thereof, or the like, and alternative techniques of forming the dielectric layer 119, such as low-pressure chemical vapor deposition (LPCVD), PVD, or the like, could alternatively be used. Next, a dielectric layer 121 is formed over the dielectric layer 119. The dielectric layer 121 may be any suitable dielectric material, such as silicon oxide, silicon nitride, or the like, formed by a suitable method, such as PVD, CVD, or the like. One or more memory device 123A, each of which includes a plurality of memory cells, are formed in the dielectric layer 121 and coupled to electrically conductive features (e.g., vias 124 and conductive lines 125) in the dielectric layer 121. Various embodiments of the memory devices 123 in FIG. 1, such as memory devices 200, 200A, and 200B, are discussed hereinafter in details.

FIG. 1 further illustrates a second layer of memory devices 123B formed over the memory devices 123A. The memory devices 123A and 123B may have a same or similar structure, and may be collectively referred to as memory devices 123, or 3D memory devices 123. The example of FIG. 1 illustrates two layers of memory devices 123 as a non-limiting example. Other numbers of layers of memory devices 123, such as one layer, three layers, or more, are also possible and are fully intended to be included within the scope of the present disclosure. The one or more layers of memory device 123 are collective referred to as a memory region 130 of the semiconductor device 100, and may be formed in the back-end-of-line (BEOL) processing of semiconductor manufacturing. The memory devices 123 may be formed in the BEOL processing at any suitable locations within the semiconductor device 100, such as over (e.g., directly over) the first region 110, over the second region 120, or over a plurality of regions.

In the example of FIG. 1, the memory devices 123 occupy some, but not all, of the areas of the memory region 130 of the semiconductor device 100, because other features, such as conductive lines 125 and vias 124, may be formed in other areas of the memory region 130 for connection to conductive features over and below the memory region 130. In some embodiments, to form the memory devices 123A or 123B, a mask layer, such as a patterned photoresist layer, is formed to cover some areas of the memory region 130, while the memory devices 123A or 123B are formed in other areas of the memory region 130 exposed by the mask layer. After the memory devices 123 are formed, the mask layer is then removed.

Still referring to FIG. 1, after the memory region 130 is formed, an interconnect structure 140, which includes dielectric layer 121 and electrically conductive features (e.g., vias 124 and conductive lines 125) in the dielectric layer 121, is formed over the memory region 130. The interconnect structure 140 may electrically connect the electrical components formed in/on the substrate 101 to form functional circuits. The interconnect structure 140 may also electrically couple the memory devices 123 to the components formed in/on the substrate 101, and/or couple the memory devices 123 to conductive pads formed over the interconnect structure 140 for connection with an external circuit or an external device. Formation of interconnect structure is known in the art, thus details are not repeated here.

In some embodiments, the memory devices 123 are electrically coupled to the electrical components (e.g., transistors) formed on the substrate 50, e.g., by the vias 124 and conductive lines 125, and are controlled or accessed (e.g., written to or read from) by functional circuits of the semiconductor device 100, in some embodiments. In addition, or alternatively, the memory devices 123 are electrically coupled to conductive pads formed over a top metal layer of the interconnect structure 140, in which case the memory devices 123 may be controlled or accessed by an external circuit (e.g., another semiconductor device) directly without involvement of the functional circuits of the semiconductor device 100, in some embodiments. Although additional metal layers (e.g., the interconnect structure 140) are formed over the memory devices 123 in the example of FIG. 1, the memory devices 123 may be formed in a top (e.g., topmost) metal layer of the semiconductor device 100, these and other variations are fully intended to be included within the scope of the present disclosure.

FIGS. 2-9, 10A, 10B, 10D, 10E, 10F, 10G, 10H, 11, and 12 illustrate various views (e.g., perspective view, cross-sectional view) of a three-dimensional (3D) memory device 200 at various stages of manufacturing, in an embodiment. The 3D memory device 200 is a three-dimensional memory device with a ferroelectric material, and may be, e.g., a 3D NOR-type memory device. The 3D memory device 200 may be used as the memory device 123A and 123B in FIG. 1. Note that for simplicity, not all features of the 3D memory device 200 are illustrated in the figures.

Figure 2:
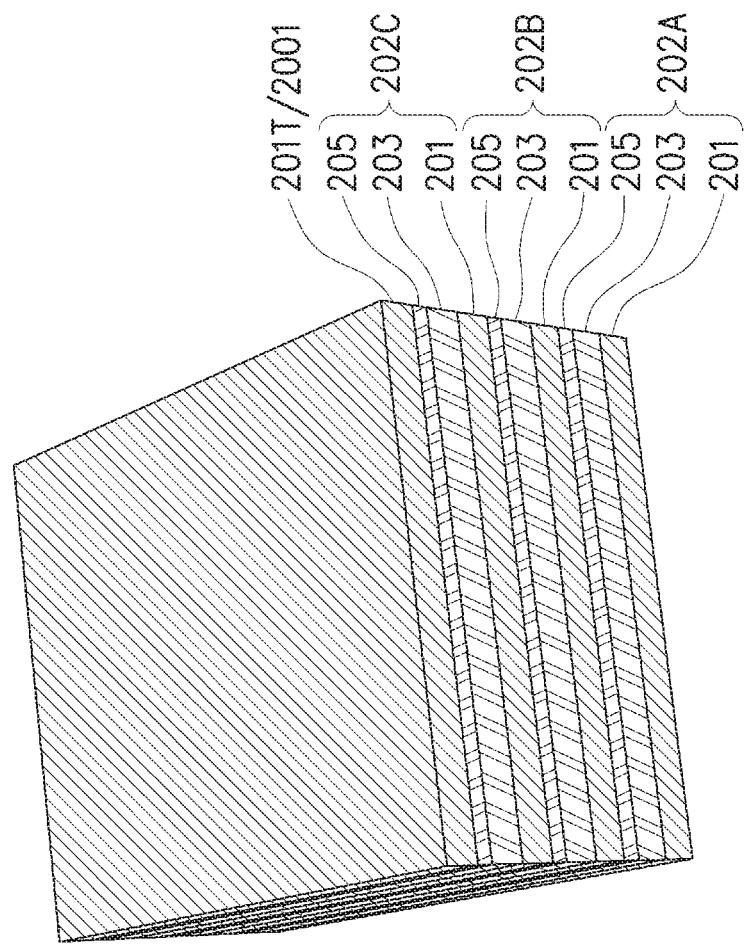

Referring now to FIG. 2, which shows a perspective view of the memory device 200 at an early stage of fabrication. As illustrated in FIG. 2, layer stacks 202A, 202B, and 202C are formed successively over the substrate 101 (not illustrated in FIG. 2 but illustrated in FIG. 1). The layer stacks 202A, 202B, and 202C may be collectively referred to as layer stacks 202 herein. The layer stacks 202A, 202B, and 202C have a same layered structure, in the illustrated embodiments. For example, each of the layer stacks 202 includes a dielectric layer 201, a channel layer 203 over the dielectric layer 201, and a source/drain layer 205 over the channel layer 203.

In some embodiments, to form the layer stack 202A, the dielectric layer 201 is formed by depositing a suitable dielectric material, such as silicon oxide, silicon nitride, or the like, over the substrate 101 (see FIG. 1) using a suitable deposition method, such as PVD, CVD, atomic layer deposition (ALD), or the like. Next, the channel layer 203 is formed over the dielectric layer 201. In some embodiments, the channel layer 203 is formed of a suitable channel material, such as a semiconductor material. Examples of the semiconductor material include amorphous-silicon (a-Si), polysilicon (poly-Si), or the like. In some embodiments, the channel layer 203 is an oxide semiconductor (may also be referred to as a semiconductive oxide), such as indium gallium zinc oxide (IGZO), zinc oxide (ZnO), indium tungsten oxide (IWO), or the like. The channel layer 203 may be formed by, e.g., PVD, CVD, ALD, combinations thereof, or the like. Next, the source/drain layer 205 is formed over the channel layer 203. In some embodiments, the source/drain metal layer 205 is formed of a metal or a metal-containing material such as Al, Ti, TiN, W, Mo, or indium tin oxide (ITO), using a suitable formation method, such as PVD, CVD, ALD, sputtering, plating, or the like. Therefore, the source/drain layer 205 may also be referred to as a source/drain metal layer 205.

In some embodiments, depending on the type (e.g., N-type or P-type) of device formed, the source/drain metal layer 205 may be formed of an N-type metal or a P-type metal. In some embodiments, Sc, Ti, Cr, Ni, Al, or the like, is used as the N-type metal for forming the source/drain metal layer 205. In some embodiments, Nb, Pd, Pt, Au, or the like, is used as the P-type metal for forming the source/drain metal layer 205. The N-type or P-type metal layer may be formed of a suitable formation method such as PVD, CVD, ALD, sputtering, plating, or the like.

After the layer stack 202A is formed, the process to form the layer stack 202A may be repeated to form the layer stacks 202B and 202C successively over the layer stack 202A, as illustrated in FIG. 1. After the layer stacks 202A, 202B, and 202C are formed, a dielectric layer 201T is formed over the layer stack 202C. In the illustrated embodiment, the dielectric layer 201T is formed of a same dielectric material as the dielectric layer 201 in the layer stacks 202, thus may also be referred to as a dielectric layer 201 in subsequent discussion.

Figure 3:
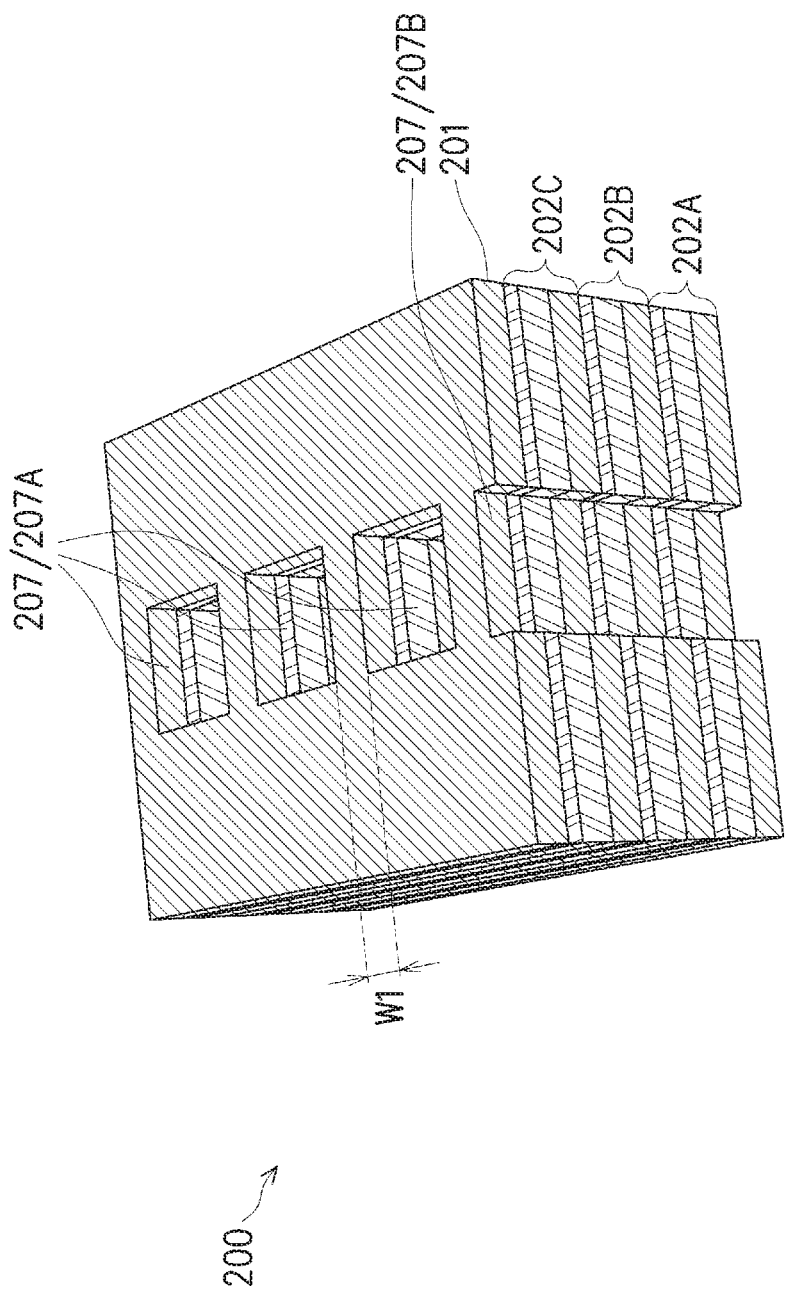

Next, in FIG. 3, openings 207 are formed that extend through the layer stacks 202A, 202B, 202C and the dielectric layer 201 over the layer stack 202C. The openings 207 may be formed using photolithography and etching techniques. The openings 207 includes first openings 207A, which are formed within boundaries (e.g., perimeters, or sidewalls) of the layer stacks 202, such that each of the first openings 207A is surrounded (e.g., encircled) by the layer stacks 202. The openings 207 also include a second opening 207B, which extends to a perimeter (e.g., a sidewall) of the layer stacks 202. In other words, the second opening 207B is not completely surrounded by the layer stacks 202. Instead, the second opening 207B is partially surrounded by the layer stacks 202. The opening 207B in FIG. 3 is illustrated as a shallow opening (e.g., extending a shallow depth from the sidewall of the layer stack 202 toward the opening 207A) in order to clearly show features formed inside the opening 207B, the opening 207B may be deeper (see, e.g., FIG. 9) than illustrated. In the example of FIG. 3, each of the first openings 207A has a rectangular shaped top view and four sidewalls, and the second opening 207B has a U-shaped top view and three sidewalls. In FIG. 3, the openings 207 are aligned in a column, and adjacent openings 207 are separated by a distance W1. In some embodiments, the distance W1 is between about 10 nm and about 50 nm.

Figure 4:
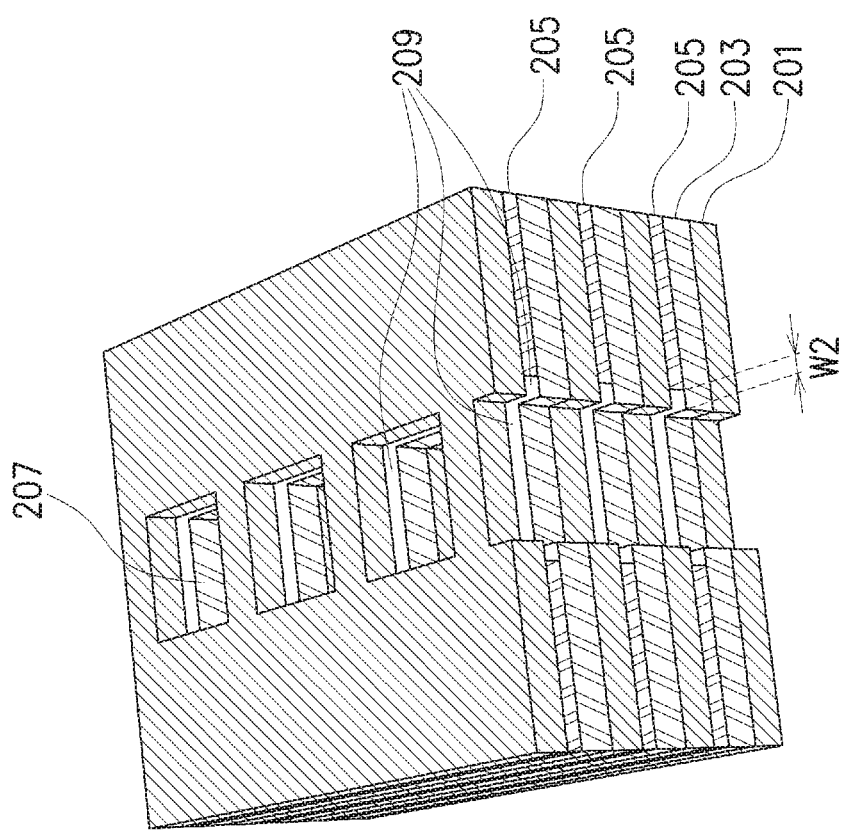

Next, in FIG. 4, portions of the source/drain layers 205 exposed by (e.g., facing) the openings 207 are removed to form recesses 209. For example, an isotropic etching process using an etchant selective to (e.g., having a higher etching rate for) the material of the source/drain layers 205 may be used to remove portions of the source/drain layers 205 facing the openings 207, such that the source/drain layers 205 are laterally recessed from the sidewalls of the openings 207 without substantially attacking other materials. In some embodiments, the etchant used in the isotropic etching process is SC1 solution, which is a mixture of deionized water, $NH_3$, and $H_2O_2$. A width W2 of the recess 209, measured between the locations of the sidewall of the source/drain layer 205 before and after the recessing of the source/drain layers 205, is between about 1 nm and about 5 nm. In the illustrated embodiment, the width W2 is larger than or equal to half of W1 (e.g., W2≥0.5×W1). Since the source/drain layers 205 are laterally recessed from the sidewalls of the openings 207 in all directions, and since W2 is larger than or equal to half of W1, the portions of the source/drain layers 205 between adjacent openings 207 are completely removed. As a result, the subsequently formed inner spacer layer 211 (see FIG. 10G) completely fills the spaces between adjacent openings 207 (or equivalently, between the subsequently formed ferroelectric material 213 along sidewalls of the openings 207).

Note that in the discussion herein, a sidewall of the layer stack 202A, 202B, or 202C includes the corresponding sidewalls of all the constituent layers (e.g., 201, 203, and 205) of that layer stack. For example, a sidewall of the layer stack 202A exposed by the opening 207 includes the corresponding sidewall of the dielectric layer 201, the corresponding sidewall of the channel layer 203, and the corresponding sidewall of the source/drain layer 205 that are exposed by the opening 207. In the illustrated embodiment, before the recessing of the source/drain layer 205, the corresponding sidewalls of the constituent layers (e.g., 201, 203, and 205) of the layer stacks 202 are aligned along a same vertical plane. After recessing of the source/drain layer 205 to form the recesses 209, the corresponding sidewalls of the dielectric layer 201 and the channel layer 203 of the layer stacks 202 are aligned along a same vertical plane, in the illustrated embodiment.

Figure 5:
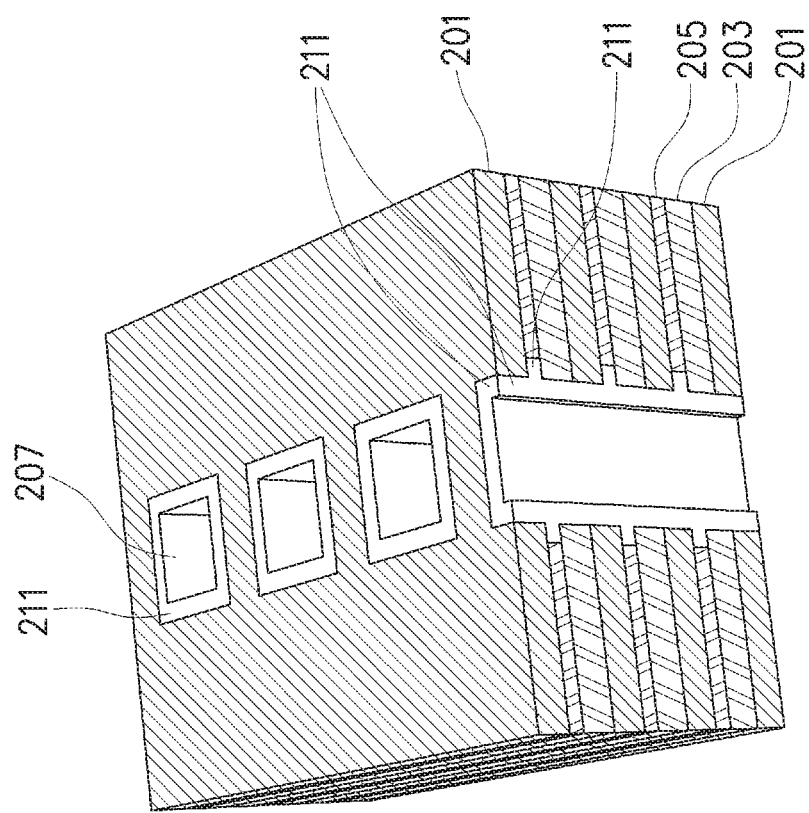

Next, in FIG. 5, an inner spacer layer 211 is formed (e.g., conformally formed) in the openings 207 to line sidewalls and bottoms of the openings 207. The inner spacer layer 211 may also be formed over the upper surface of the topmost dielectric layer 201 in FIG. 5. The inner spacer layer 211 is formed of a suitable dielectric material, such as silicon nitride (SiN), silicon carbon nitride (SiCN), silicon carbon oxynitride (SiCON), or the like, using a suitable method such as CVD, PVD, ALD, or the like. A thickness of the inner spacer layer 211 may be between about 1 nm and about 5 nm, as an example. The inner spacer layer 211 fills the recesses 209, as illustrated in FIG. 5.

Figure 6:
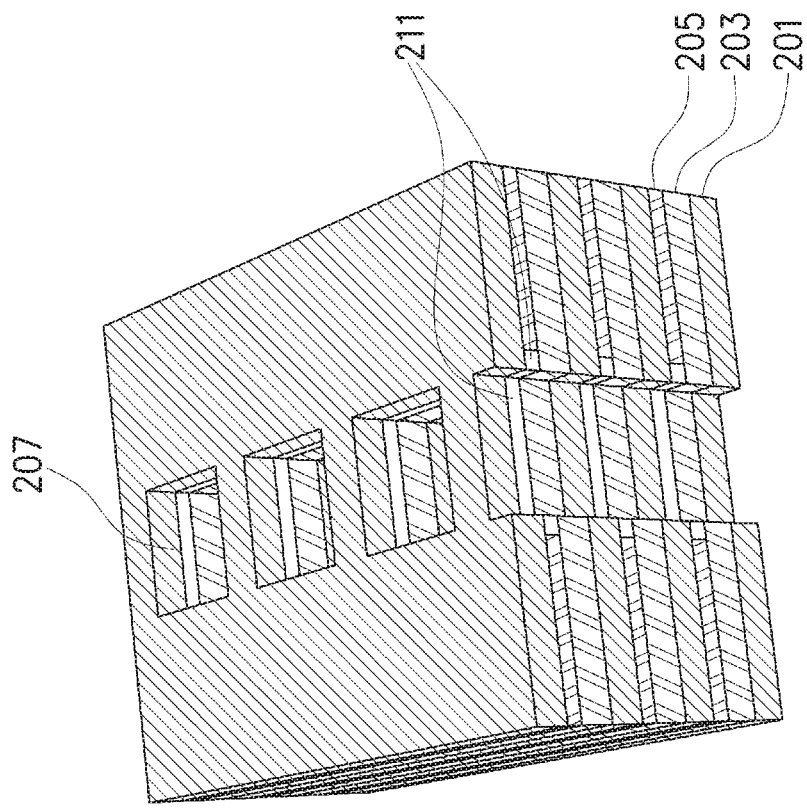

Next, in FIG. 6, portions of the inner spacer layer 211 along the sidewalls of the openings 207 and the bottoms of the openings 207 are removed, e.g., by an anisotropic etching process such as plasma etching. The anisotropic etching process is performed to remove portions of the inner spacer layer 211 from the sidewalls and the bottoms of the openings 207, and to remove the inner spacer layer 211 from the upper surface of the topmost dielectric layer 201 (if formed). After the anisotropic etching process, the inner spacer layer 211 in the recesses 209 remain, and may also be referred to as inner spacers 211. In the example of FIG. 6, sidewalls of the inner spacers 211 facing the openings 207 are aligned with respective sidewalls of the dielectric layers 201 and respective sidewalls of the channel layers 203. The inner spacers 211 may advantageously lower the parasitic capacitance of the device formed, in some embodiments.

Figure 7:
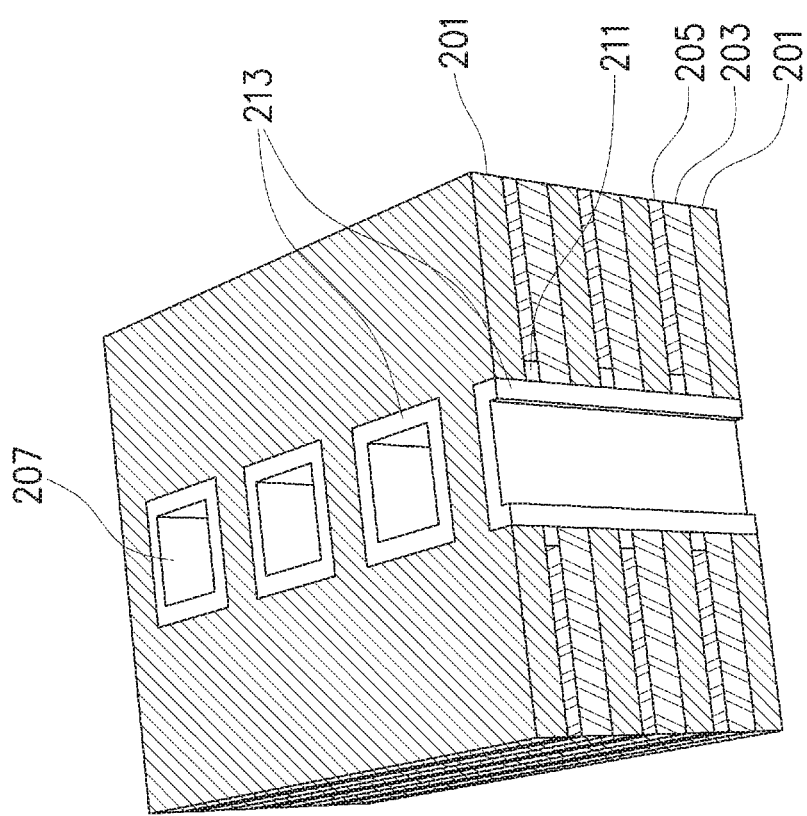

Next, in FIG. 7, a ferroelectric material 213 is formed (e.g., conformally formed) in the openings 207 to line the sidewalls and the bottoms of the openings 207. The ferroelectric material 213 may also be formed over the upper surface of the topmost dielectric layer 201 in FIG. 7. The ferroelectric material 213 is hafnium oxide ($HfO_2$) doped by Al, Si, Zr, La, Gd, or Y, in an embodiment. In some embodiments, a ferroelectric material, such as HZO, HSO, HfSiO, HfLaO, $HfZrO_2$, or $ZrO_2$, is used as the ferroelectric material 213. A suitable formation method, such as PVD, CVD, ALD, or the like, may be used to form the ferroelectric material 213. Next, an anisotropic etching process may be performed to remove the ferroelectric material 213 from the upper surface of the topmost dielectric layer 201 (if formed) and from the bottoms of the openings 207.

Figure 8:
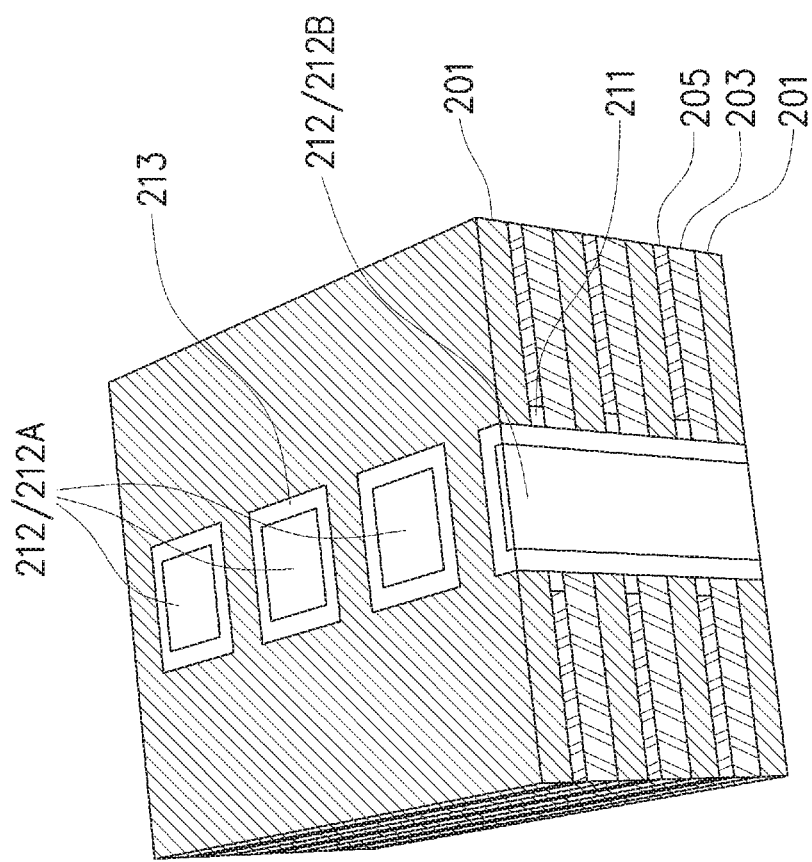

Next, in FIG. 8, an electrical conductive material (also referred to as a gate material, or a gate metal), such as Al, W, Mo, TiN, TaN, combinations thereof, or multilayers thereof, is formed to fill the openings 207. The gate material may be formed by a suitable method, such as PVD, CVD, ALD, plating, or the like. After the gate material is formed, a planarization process, such as a chemical mechanical planarization (CMP), may be performed to remove excess portions of the gate material from the upper surface of the topmost dielectric layer 201, and the remaining portions of the gate material in the openings 207 form gate electrodes 212 (e.g., 212A and 212B). The gate electrodes 212 include first gate electrodes 212A formed in the first openings 207A (see FIG. 3), and a second gate electrode 212B formed in the second opening 207B. In subsequent processing, the second gate electrode 212B is removed, and therefore, the second gate electrode 212B is also referred to as a dummy gate electrode.

Figure 9:
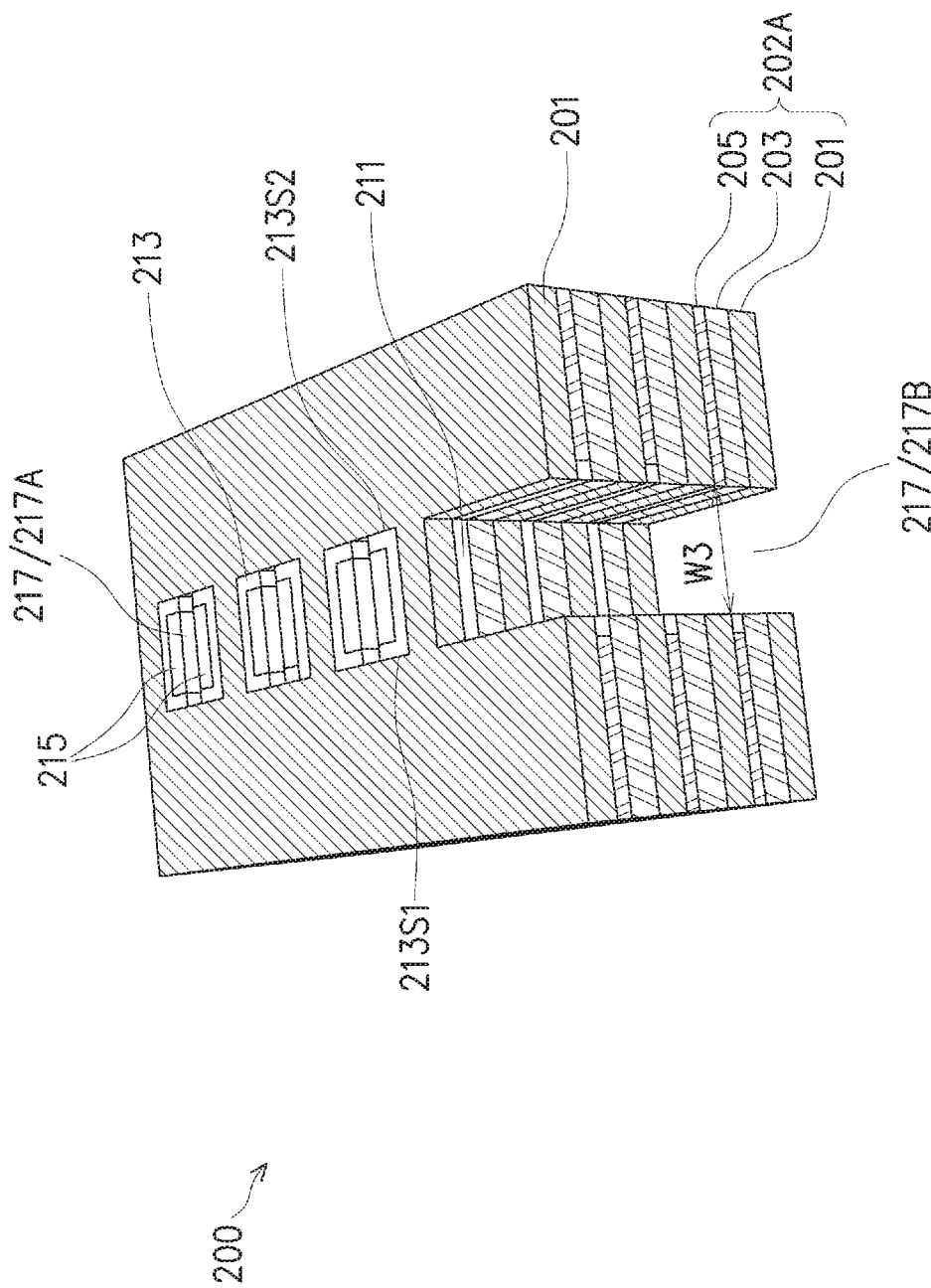

Next, in FIG. 9, openings 217 (e.g., 217A and 217B) are formed that extend through the topmost dielectric layer 201 and the layer stacks 202. The openings 217 may be formed using photolithography and etching techniques. The openings 217 includes trenches 217A (may also be referred to as slot-shaped openings 271A) formed in the first gate electrodes 212A, and a recess 217B formed at locations of the second gate electrode 212B (see FIG. 8) and the ferroelectric material 213 around the second gate electrode 212B. In other words, forming the recess 217B removes the second gate electrode 212B of FIG. 8 and the ferroelectric material 213 around the second gate electrode 212B. The recess 217B in FIG. 9 extends from a sidewall of the layer stacks 202 toward the gate electrodes.

Note that each of the trenches 217A bisects (e.g., cuts or separates into two separate portions) a respective first gate electrode 212A into two separate gate electrodes 215 (which are also referred to as a pair of gate electrodes 215). Therefore, the number of gate electrodes 215 is twice that of the first gate electrodes 212A. In addition, each of the trenches 217A also bisects the ferroelectric material 213 around each of the first gate electrodes 212A. Note that in the example of FIG. 9, the trenches 217A stop at the outer sidewalls 213S1 and 213S2 of the ferroelectric material 213. The recess 217B has a width W3 between opposing sidewalls of the recess 217B. The width W3 may be between, e.g., 50 nm and about 150 nm, as an example. In the example of FIG. 9, the openings 217 are aligned in a row, such that the opposing sidewalls of the recess 217B are aligned with respective opposing sidewalls of the trenches 217A, which are aligned with the outer sidewalls 213S1/213S2 of the ferroelectric material 213.

Figure 10A:
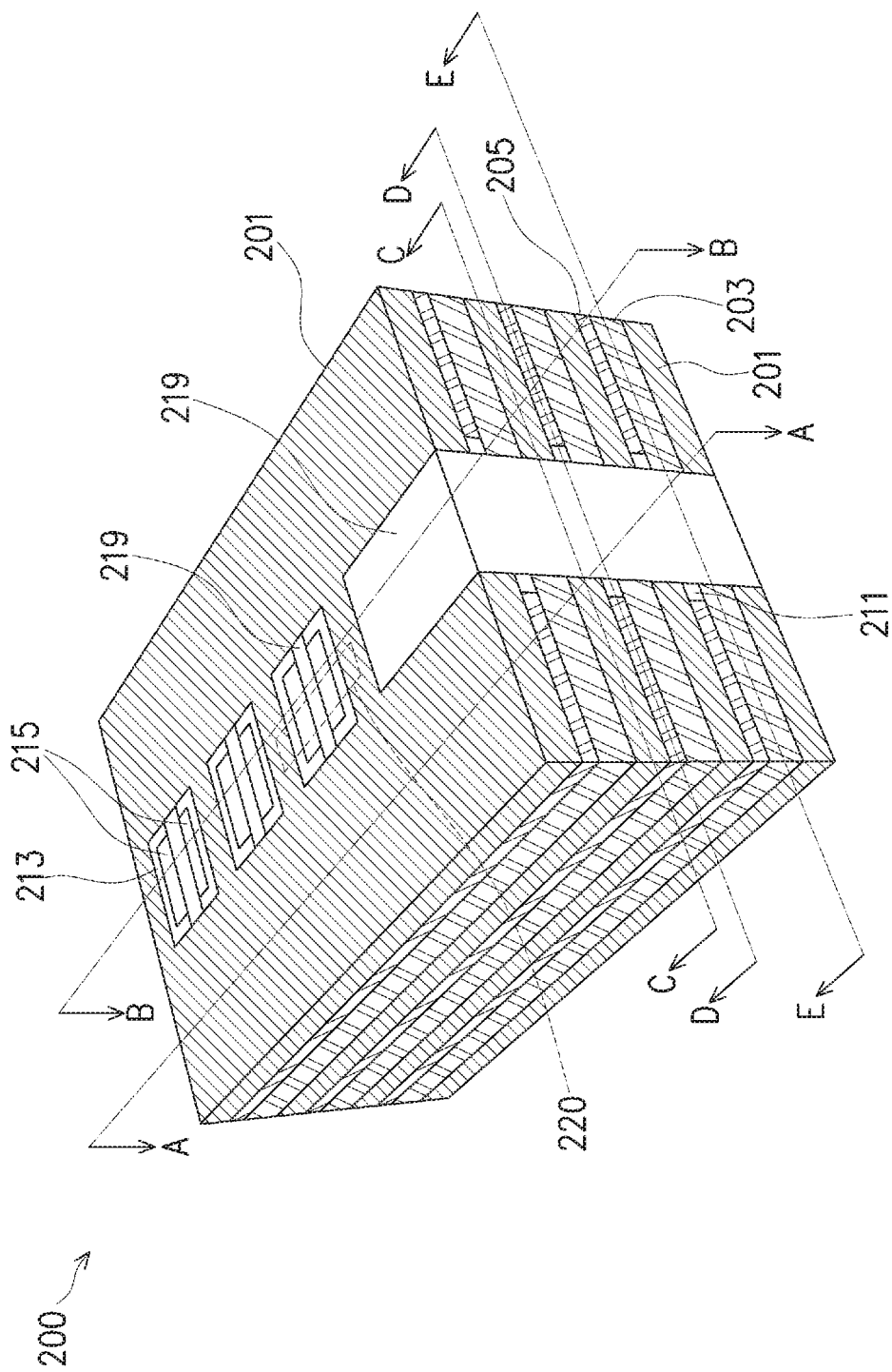

Next, in FIG. 10A, a dielectric material 219 is formed to fill the openings 217. The dielectric material 219 may be, e.g., silicon oxide, silicon nitride, or the like, formed by a suitable method such as CVD, PVD, ALD, or the like. A planarization process, such as CMP, may be performed to remove excess portions of the dielectric material 219 from the upper surface of the topmost dielectric layer 201. The dielectric material 219 thus form isolation regions that electrically isolate each pair of gate electrodes 215 from each other.

Figure 10B:
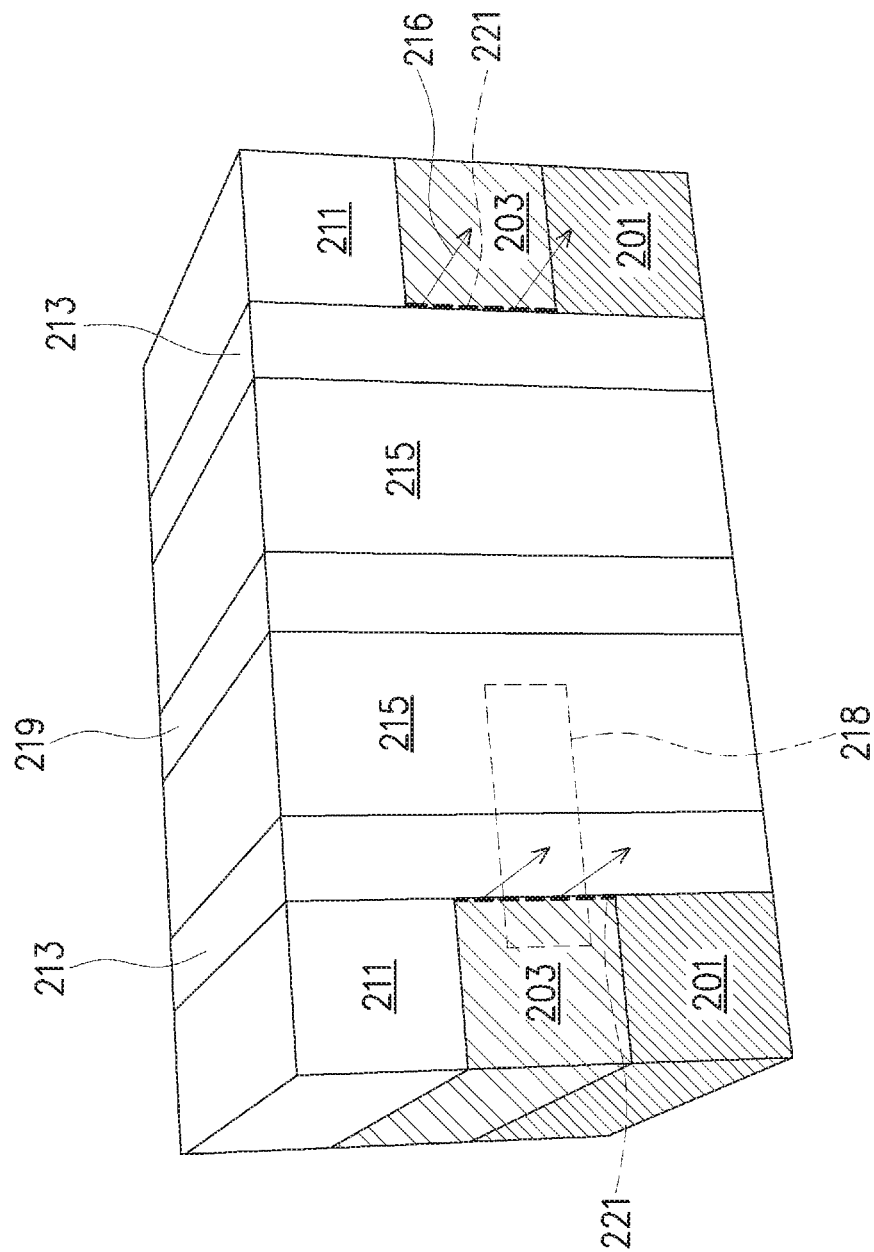

FIG. 10B illustrates a perspective view of a portion of the memory device 200 of FIG. 10A. In particular, FIG. 10B illustrates a cut-out portion of the memory device 200 within the dashed box 220 in FIG. 10A. For simplicity, only portions of the memory device 200 located at the same levels (e.g., distance from the substrate 101) as the layers of the layer stacks 202C are illustrated in FIG. 10B.

As illustrated in FIG. 10B, the dielectric material 219 cuts each of the first gate electrodes 212A (see FIG. 8) into a pair of gate electrodes 215. The ferroelectric material 213 extends along sidewalls of the gate electrodes 215, and is disposed between the gate electrode 215 and a respective channel layer 203. The dashed lines 221 in FIG. 10B illustrate the channel regions formed in the channel layers 203 during operation of the 3D memory device 200, e.g., when a gate voltage is applied at the gate electrode 215. The arrows 216 in FIG. 10B illustrate example electrical current flow directions between source/drain regions (see 205A/205B in FIG. 10G), which are outside of (e.g., in front of and behind) the cut-out portion of FIG. 10B.

FIG. 10C illustrates switching of the electrical polarization direction of the ferroelectric material 213 of the three-dimensional memory device 200. Three layers of different materials (e.g., 215, 213, and 203) within the dashed box 218 of FIG. 10B are illustrated on the left side of FIG. 1C. FIG. 10C shows that when the direction of an electrical field (E-field) applied to the ferroelectric material 213 is switched, the electric polarization direction of the ferroelectric material 213 switches accordingly, as illustrated in FIG. 1C. For example, an electrical field may be applied to the ferroelectric material 213 in FIG. 10C by applying a voltage between the gate electrode 215 and a respective source/drain layer 205 that is electrically coupled to (e.g., over and contacting) the channel layer 203 in FIG. 1C. For example, a voltage may be applied to a source/drain region 205 in the staircase-shaped region (see, e.g., FIG. 12) of the 3D memory device 200 through source/drain contact 227.

FIGS. 10D and 10E illustrate cross-sectional views of the 3D memory device 200 of FIG. 10A along cross-sections A-A and B-B, respectively. FIG. 10D shows the layer stacks 202A, 202B, and 202C, as well as the topmost dielectric layer 201. FIG. 10E shows the cross-sectional view of the 3D memory device 200 along cross-section B-B. In FIG. 10E, each pair of gate electrodes 215 are separated by the dielectric material 291 in between. The ferroelectric material 213 extends along sidewalls of the gate electrodes 215.

Note that in the cross-sectional view of FIG. 10E, the source/drain layer 205 in each of the layer stacks 202 is replaced by the inner spacers 211. As illustrated in FIG. 10E, the inner spacers 211 fill the space between the ferroelectric material 213 disposed along sidewalls of adjacent gate electrodes 215, and has a width W1. In other words, no source/drain layer 205 is visible in the cross-sectional view of FIG. 10E. Recall that the width W2 (see FIG. 4) of the recess 209 is larger than or equal to half of the distance W1 between adjacent openings 207. As a result, the inner spacers 211 fill the recesses 209 and completely fill the spaces between adjacent openings 207. Note that the sidewalls of the ferroelectric material 213 facing the inner spacers 211 in FIG. 10E are at the same locations as the sidewalls of the openings 207 before the recesses 209 are formed.

The dashed lines 221 in FIG. 10E (also illustrated in FIG. 10B) illustrates the channel regions formed during operation of the 3D memory device 200. The electrical current flows in and out of the paper along the channel regions in the cross-sectional view of FIG. 10E. FIG. 10E further illustrate a plurality of memory cells 223, where each memory cell 223 includes portions of the various layers/materials within the area of the memory cells 223. For example, each memory cell 223 includes (portions of) the gate electrode 215, the ferroelectric material 213, the inner spacer 211, the dielectric layer 201, the channel layer 203, and source/drain regions 205A/205B (see FIG. 10G). Therefore, each memory cell 223 is a transistor with the ferroelectric material 213 between the gate electrode 215 and the channel layer 203 (see FIG. 10F). Note that to avoid clutter, FIG. 10E only shows dashed boxes around two memory cells 223 of the 3D memory device 200, and dashed boxes are not shown around other memory cells of the 3D memory device 200.

Figure 10F:
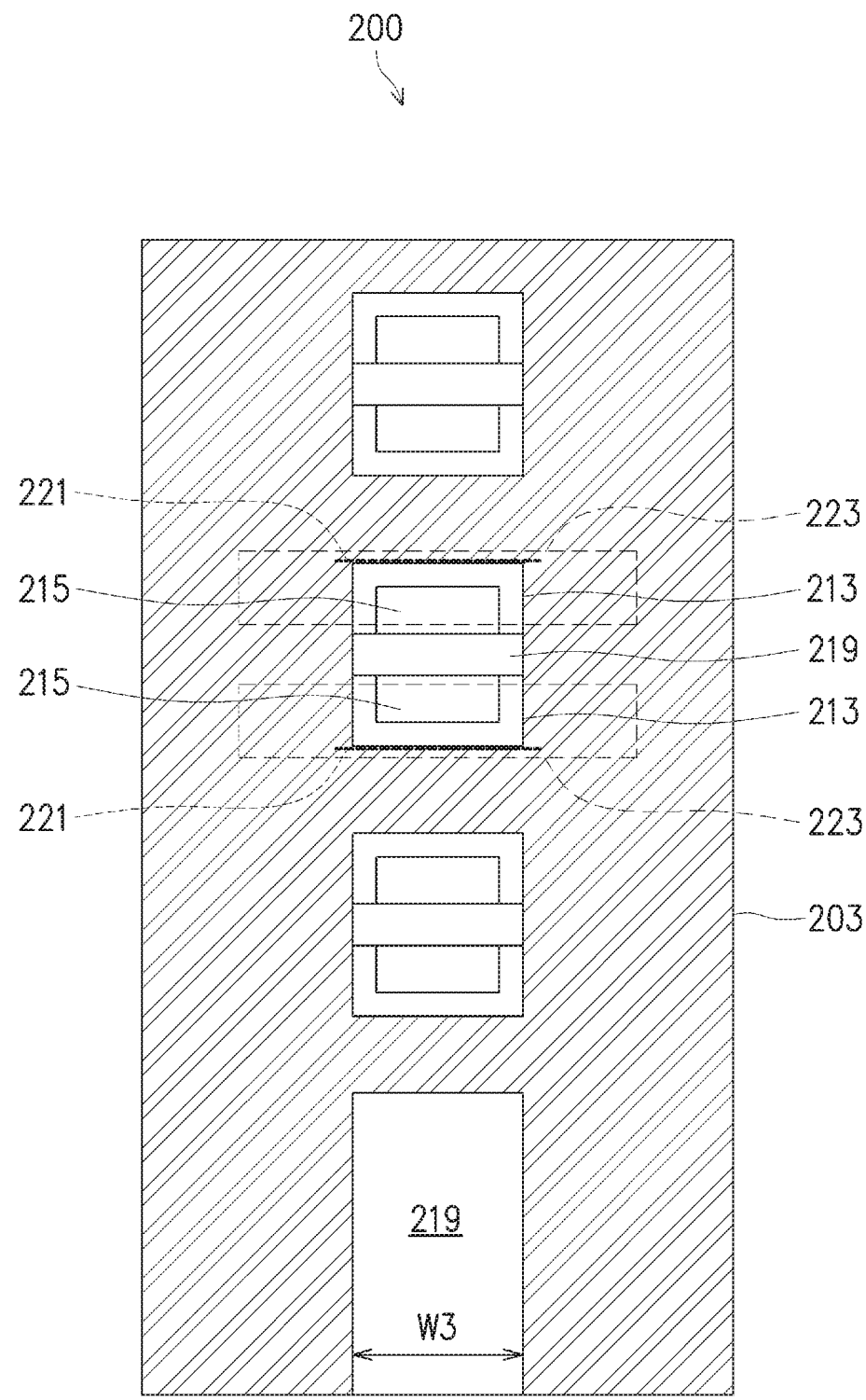

FIG. 10F illustrates a cross-sectional view of the 3D memory device 200 of FIG. 10A along cross-sectional E-E. The cross-section E-E is along a horizontal plane that cuts across the channel layer 203. As illustrated in FIG. 10F, each pair of gate electrodes 215 contact and extend along opposing sidewalls of the dielectric material 219 disposed in between. The ferroelectric material 213 extends along sidewalls (e.g., three sidewalls) of the gate electrode 215, and is disposed between the gate electrodes 215 and the channel layer 203. Sidewalls of the ferroelectric material 213 are aligned with respective sidewalls of the dielectric material 219, such that a width of the ferroelectric material 213 in FIG. 10F, measured along the horizontal direction of FIG. 10F, is the same as a width of the dielectric material 219 measured along the same horizontal direction. In addition, FIG. 10F shows dashed boxes around two of the memory cells 223, and the dashed lines 221 shows the channel regions in two of the memory cells.

Figure 10G:
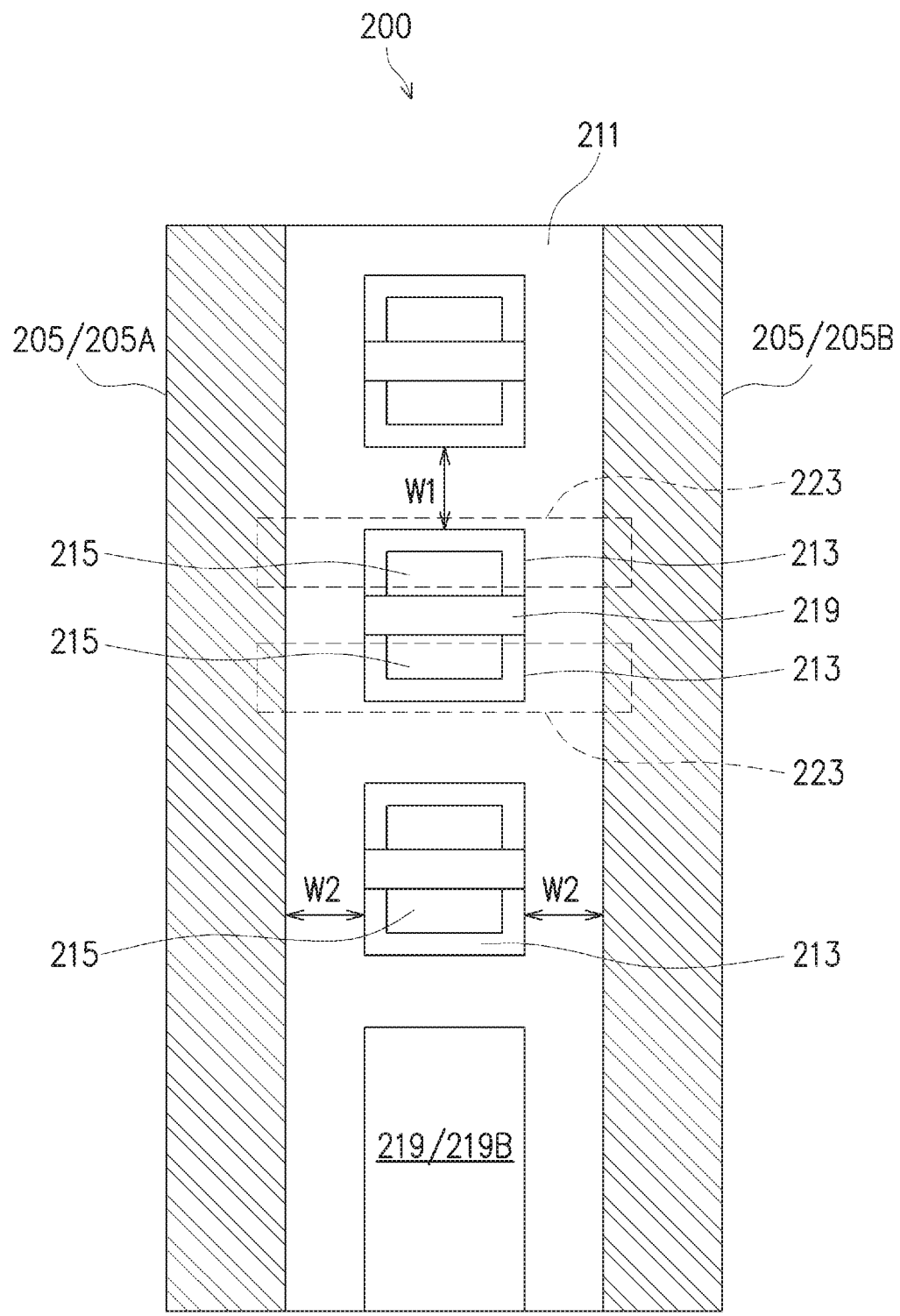

FIG. 10G illustrates a cross-sectional view of the 3D memory device 200 of FIG. 10A along cross-sectional D-D. The cross-section D-D is along a horizontal plane that cuts across the source/drain layer 205. As illustrated in FIG. 10G, the inner spacer layer 211, which is a continuous region in the cross-sectional view of FIG. 10G, completely fills the spaces between portions of the ferroelectric material 213 along adjacent gate electrodes 215, and also fills the space between the lowermost portion 219B of the dielectric material 219 and the lowermost portion of the ferroelectric material 213 in FIG. 10G. As a result, the inner spacer layer 211 separates the source/drain layer 205 into two separate (e.g., spaced apart) source/drain regions 205A and 205B.

When the transistor of a memory cell 223 is turned on and a voltage is applied between the source/drain regions 205A and 205B, electrical current flows between the source/drain regions 205A/205B. For example, referring to FIGS. 10A, 10B, 10E, 1° F., and 10G, the electrical current may flow downward from the source/drain region 205A (see FIGS. 10A and 10G) to an underlying portion of the channel layer 203 (see FIGS. 10A and 10F), then flow horizontally along channel region 221 (see FIG. 10F) to a portion of the channel layer 203 under the source/drain region 205B (see FIG. 10G), then flow upward to the source/drain region 205B. Note that in the description of current flow above, the directions "downward," "upward," "horizontal" are relative to the orientation illustrated in FIG. 10A.

Figure 10H:
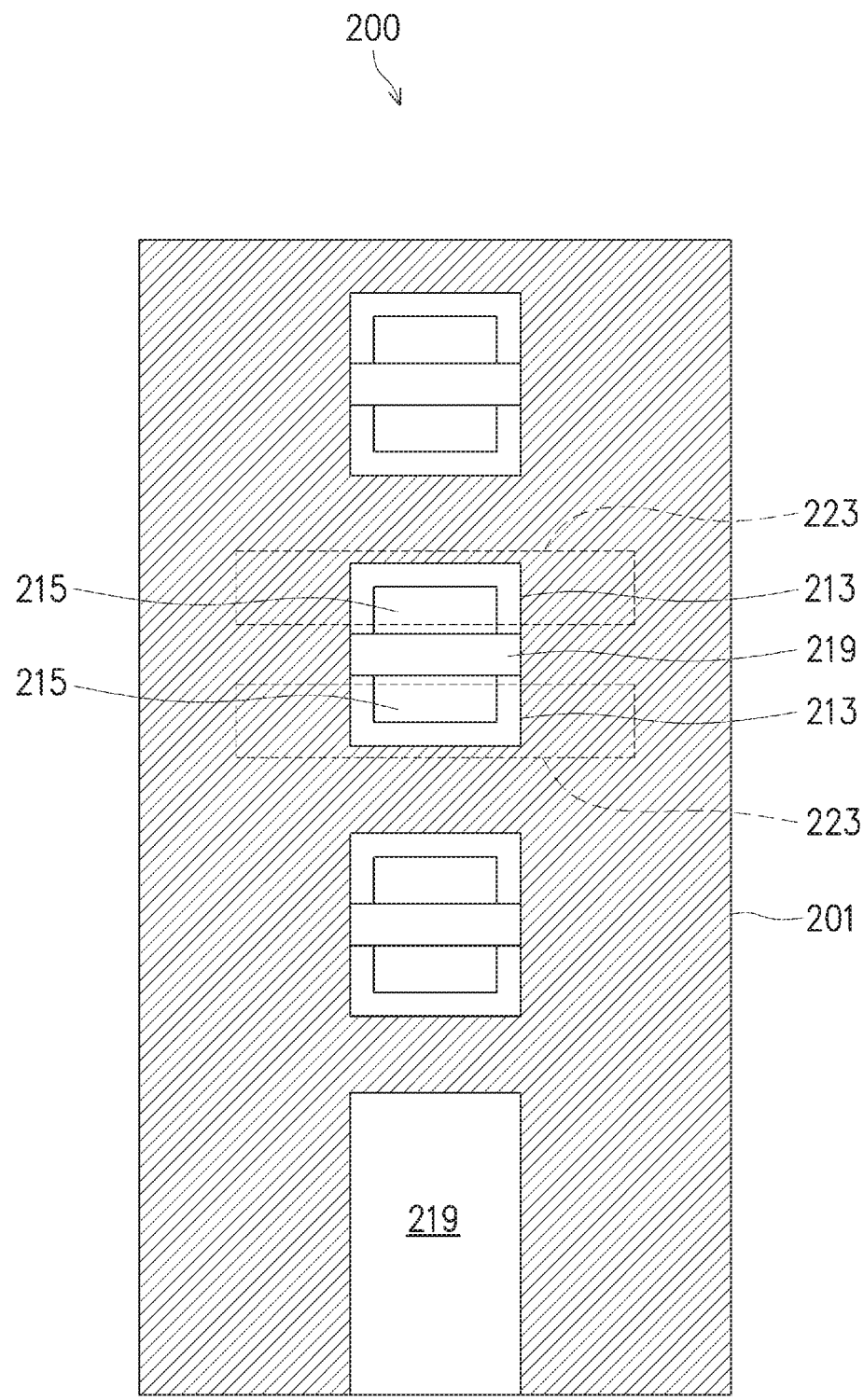

FIG. 10H illustrates a cross-sectional view of the 3D memory device 200 of FIG. 10A along cross-sectional C-C. The cross-section C-C is along a horizontal plane that cuts across the dielectric layer 201.

Figure 11:
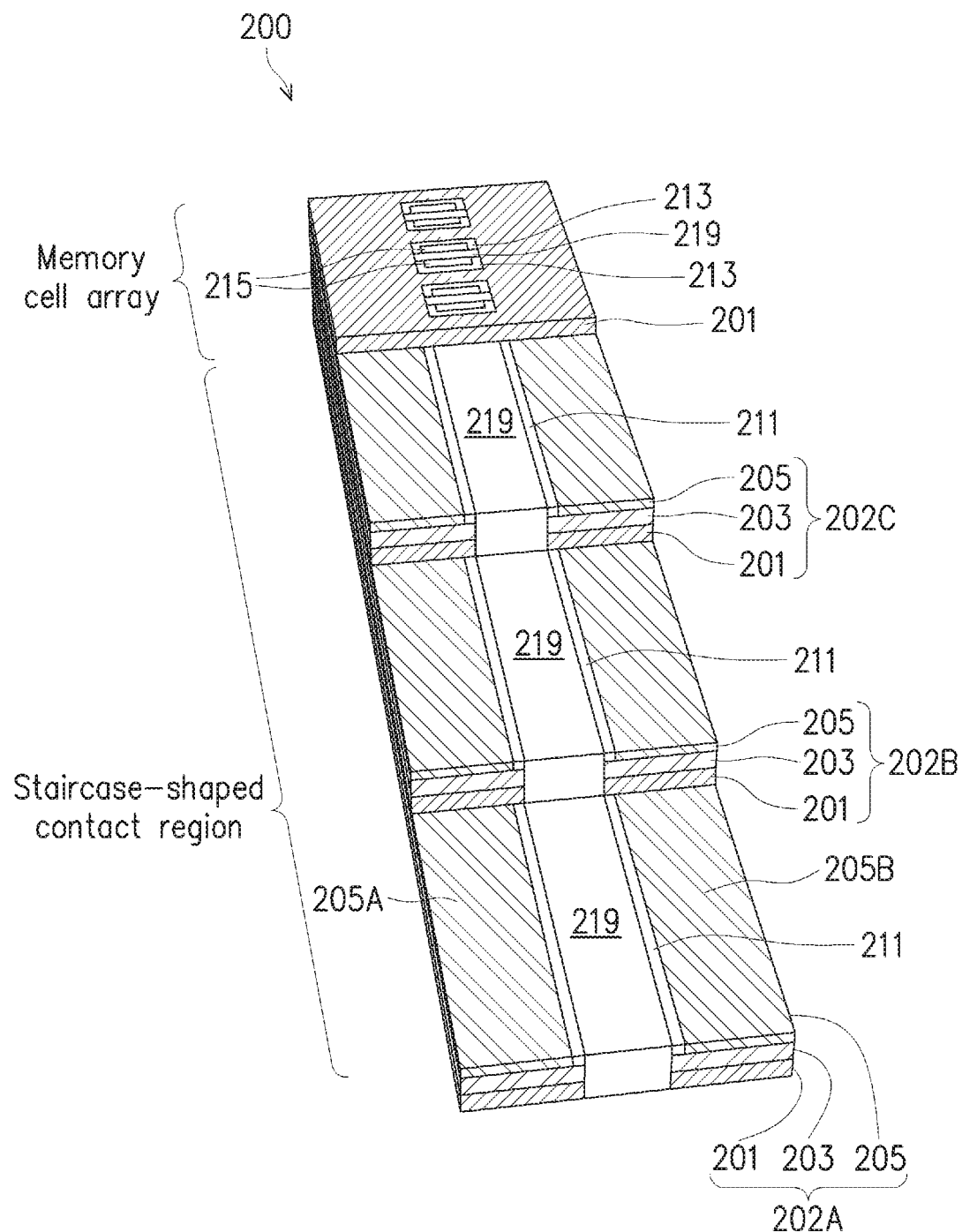

Next, in FIG. 11, a staircase-shaped contact region is formed in the 3D memory device 200, so that a portion of the source/drain layer 205 of each of the layer stacks 202 is exposed. The staircase-shaped contact region may be formed by a plurality of etching processes, where each of the etching processes is performed by using a different etching mask to expose a different portion of the 3D memory device 200 for removal, and by etching for a different duration to achieve different etching depth, as an example. The unetched portion of the 3D memory device 200, which includes the gate electrodes 215 and the ferroelectric material 213 around the gate electrodes 215, form the memory cell array of the 3D memory device 200.

As illustrated in FIG. 11, a portion of each of the layer stacks 202 laterally distal from the memory cell array is removed to form the staircase-shaped contact region. The areas of the removed portion of the layer stack 202 increase along a vertical direction away from the substrate 101 (see FIG. 1). In other words, the higher (further away from the substrate 101) is the layer stack 202 (e.g., 202A, 202B, or 202C), the more areas of the layer stack are removed. Note that the source/drain layer 205 in each of the layer stacks 202 is separated into two separate source/drain regions 205A and 205B that are disposed on opposing sides of the dielectric material 219.

Figure 12:
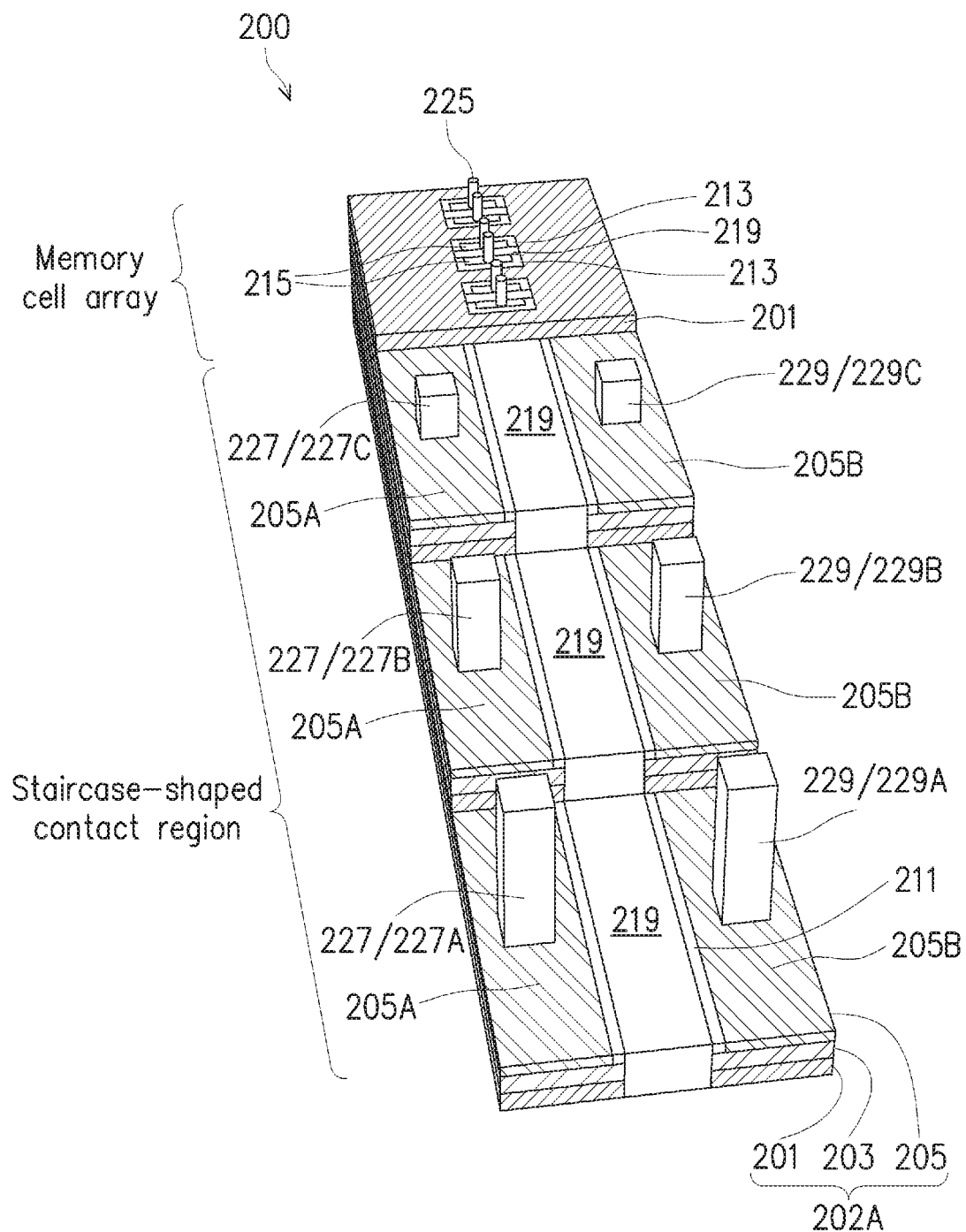

Next, in FIG. 12, gate contacts 225 are formed over and electrically coupled to the gate electrodes 215, source/drain contacts 227 (e.g., 227A, 227B, and 227C) are formed over and electrically coupled to the source/drain regions 205A, and source/drain contacts 229 (e.g., 229A, 229B, and 229C) are formed over and electrically coupled to the source/drain regions 205B. In the context of memory device, each of the gate contacts 225 may also be referred to as a word line (WL), each of the source/drain contacts 227 may also be referred to as a source line (SL), and each of the source/drain contacts 229 may also be referred to as a bit line (BL). The gate contacts 225 and the source/drain contacts 227/229 may be formed by forming a dielectric layer (not shown) over the structure of FIG. 11, forming openings in the dielectric layer at locations corresponding to the gate contacts 225 and the source/drain contacts 227/229, where the openings expose the underlying conductive feature (e.g., gate electrodes 215, or the source/drain regions 205A/205B), and filling the openings with an electrically conductive material, such as Cu, W, Au, Ag, Co, Ti, Ta, TaN, TiN, combinations thereof, multilayers thereof, or the like. In some embodiments, the openings in the dielectric layer (not shown) for forming the source/drain contacts 227/229 are formed by etching the dielectric layer using an etchant selective to (e.g., having a higher etching rate for) the material of the dielectric layer. The selective etching may be performed until all the contact openings in the staircase-shaped contact region are formed. Therefore, the source/drain regions 205A/205B in higher layer stacks (e.g., 202C) underlying the contact openings may be exposed to the etchant for a longer period of time than the source/drain regions 205A/205B in lower layer stacks (e.g., 202B, or 202A) underlying the contact openings. As a result, a thickness of the portions of the source/ drain regions 205A/205B directly under (e.g., contacting) the source/drain contacts 227/229 in a higher layer stack (e.g., 202C) may be smaller than that in a lower layer stack (e.g., 202B or 202A), while portions of the source/drain regions 205A/205B outside the lateral extents (e.g., beyond sidewalls) of the source/drain contact 227/229 in all layer stacks (e.g., 202A, 202B, and 202C) may have a same thickness.

As illustrated in FIG. 12, due to different upper surfaces of the source/drain layers 205 of the layer stacks 202 being at different vertical levels (e.g., distances from the substrate 101), lower surfaces of the source/drain contacts 227 (or 229) on different layer stacks 202 are also at different vertical levels. For example, the lower surfaces of the source/drain contacts 227 (or 229) on the layer stack 202A are closer to the substrate 101 than the lower surfaces of the source/drain contacts 227 (or 229) on the layer stacks 202B/202C.

In the example of FIG. 12, six gate electrodes 215 are shown. Each of the gate electrodes 215 and the source/drain contacts 227/229 coupled to the source/drain regions 205A/205B at a same vertical level define the three terminals of a memory cell (e.g., a transistor with ferroelectric material 213). Therefore, in the example of FIG. 12, the six gate electrodes 215 and the three pairs of source/drain contacts 227/229 form a total of 18 memory cells.

Referring to FIG. 12 and FIGS. 10E-10G, to perform a write operation on a particular memory cell, e.g., the memory cell 223 in FIG. 10E, a write voltage is applied across a portion of the ferroelectric material 213 within the memory cell 223. The write voltage may be applied, for example, by applying a first voltage to the gate electrode 215 of the memory cell 223 (through the gate contact 225), and applying a second voltage to the source/drain regions 205A/205B (through source/drain contacts 227/229). The voltage difference between the first voltage and the second voltage sets the polarization direction of the ferroelectric material 213. Depending on the polarization direction of the ferroelectric material 213, the threshold voltage VT of the corresponding transistor of the memory cell 223 can be switched from a low threshold voltage VL to a high threshold voltage VH, or vice versa. The threshold voltage value (VL or VH) of the transistor can be used to indicate a bit of "0" or a "1" stored in the memory cell.

To perform a read operation on the memory cell 223, a read voltage, which is a voltage between the low threshold voltage VL and the high threshold voltage VH, is applied to the transistor, e.g., between the gate electrode 215 and the source/drain region 205A. Depending on the polarization direction of the ferroelectric material 213 (or the threshold voltage of the transistor), the transistor of the memory cells 223 may or may not be turned on. As a result, when a voltage is applied, e.g., at the source/drain region 205B, an electrical current may or may not flow between the source/drain regions 205A and 205B. The electrical current may thus be detected to determine the digital bit stored in the memory cell.

Figure 13:
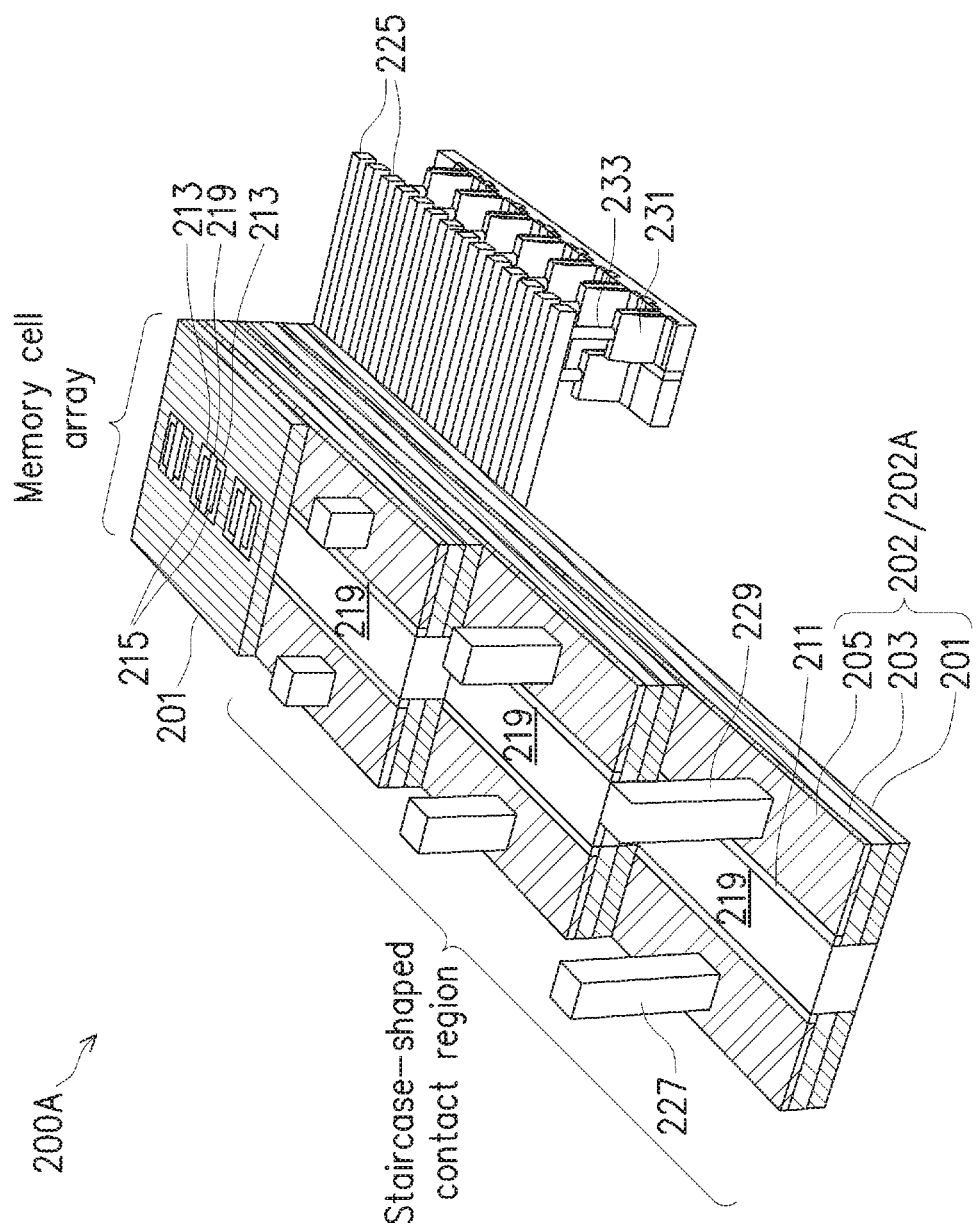
FIG. 13 illustrates a perspective view of a three-dimensional memory device, in another embodiment.

FIG. 13 illustrates a perspective view of a three-dimensional (3D) memory device 200A, in another embodiment. The 3D memory device 200A is similar to the 3D memory device 200 of FIG. 12, but with the gate contacts 225 formed under the layer stack 202A. Since the gate electrodes 215 extend through the layer stacks 202, lower surfaces of the gate electrodes are exposed at the lower surface of the layer stack 202. Therefore, forming gate contacts 225 under the gate electrodes 215 may be easily achieved. For example, before forming the layer stack 202A in FIG. 2, a metal layer may be formed over the dielectric layer 119 in FIG. 1 to form metal features (e.g., 225) at locations over which the gate electrodes 215 are formed in subsequent processing. In subsequent process, once formed, the gate electrodes 215 will be electrically coupled to the gate contacts 225 in the metal layer.

FIG. 13 further illustrates transistors 231 and vias 233 that electrically couple the gate contacts 225 to the transistors 231. The transistors 231 and vias 233 are part of the semiconductor device 100 of FIG. 1 and not part of the 3D memory device 200A, in the illustrated embodiment. The transistors 231 may be the FinFETs formed over the substrate 101 of FIG. 1, and the vias 233 may be formed under the 3D memory device 200A to electrically couple to the FinFETs.

Figure 14:
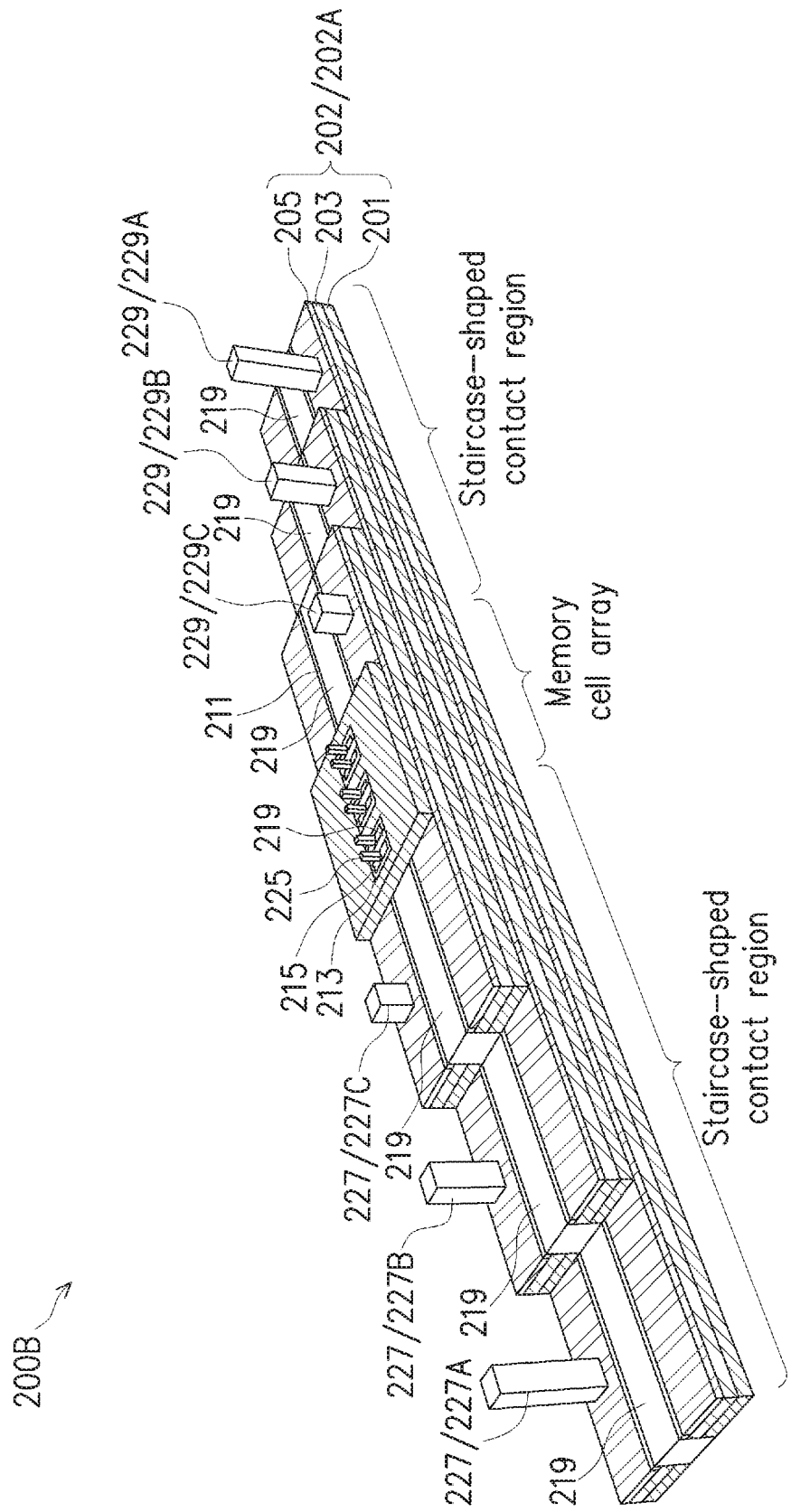
FIG. 14 illustrates a perspective view of a three-dimensional memory device, in yet another embodiment.

FIG. 14 illustrates a perspective view of a three-dimensional (3D) memory device 200B, in yet another embodiment. The 3D memory device 200B is similar to the 3D memory device 200 of FIG. 12, but with the memory cell array formed in the middle region of the 3D memory device 200B, and with two staircase-shaped contact regions formed on opposing sides of the memory cell array. The 3D memory device 200B may be formed by modifying the fabrication process for the 3D memory device 200. For example, in the process step of FIG. 3, two second openings 207B are formed on opposing sides of the first openings 207A. The rest of the processing steps are similar to those for the 3D memory device 200, thus details are not repeated.

Figure 15:
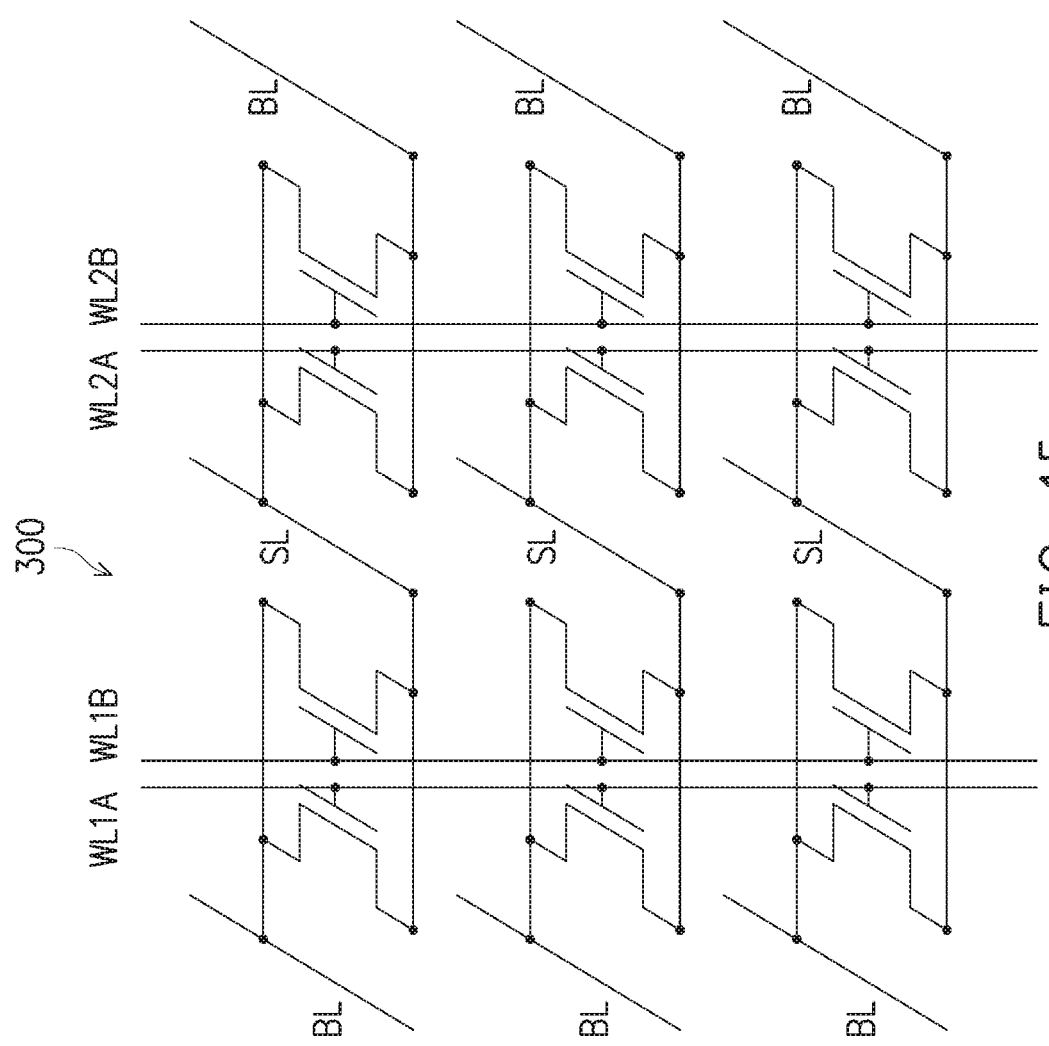
FIG. 15 illustrates an equivalent circuit diagram of a three-dimensional memory device, in an embodiment.

FIG. 15 illustrates an equivalent circuit diagram 300 of a three-dimensional memory device, in an embodiment. The circuit diagram 300 corresponds to a portion of the 3D memory device 200, 200A, or 200B, in an embodiment. Memory cells in the circuit diagram 300 are illustrated as transistors with terminals labeled as SL, BL, and WL (e.g., WL1A, WL1B, WL2A, or WL2B), where terminals SL, BL, and WL correspond to the gate contacts 225, the source/drain contacts 227, and the source/drain contacts 229, respectively. Three layers of memory cells are illustrated in FIG. 15, which corresponds to the memory cells formed in the three layer stacks 202 in FIGS. 12, 13, and 14. The WLs extend vertically to electrically connect the memory cells implemented in different layer stacks 202.

Variations and modifications to the disclosed embodiments are possible and are fully intended to be included within the scope of the present disclosure. For example, three layer stacks 202 (e.g., 202A, 202B, and 202C) are illustrated in the 3D memory devices 200, 200A, and 200B as a non-limiting example. The number of layer stacks 202 in the 3D memory device can be any suitable number, such as one, two, or more than three, as skilled artisan readily appreciate. In addition, the top view of the openings 207 are illustrated as rectangles or squares, other shapes for the openings 207 (thus other shapes for the gate electrodes 215), such as circle, oval, or polygon, may also be used.

Embodiments may achieve advantages. The disclosed 3D memory devices can be easily integrated into existing semiconductor devices during the BEOL processing. The areas under the 3D memory devices can still be used to form various circuits, such as logic circuits, I/O circuits, or ESD circuits during the FEOL processing. Therefore, besides the peripheral circuits (e.g., decoders, amplifiers) and routing circuits used for the 3D memory devices, there is little penalty in terms of foot print for implementing the disclosed 3D memory devices. In addition, the disclosed 3D memory devices have highly efficient structures to reduce its memory cell size. For example, the BL and SL coupled to the source/drain layer 205 of a layer stack are shared by all the memory cells formed within the same layer stack. The WL is connected to the gate electrode 215 which extends through all the layer stacks 202, and therefore, the WL is also shared by vertically aligned memory cells formed in different layer stacks. By cutting the first gate electrode 212A into a pair of gate electrodes 215, the number of memory cells in the 3D memory device is easily doubled. As discussed above, the disclosed 3D memory devices have structures that can be scaled easily to allow for high-density memory arrays to be formed, which is important for emerging applications such as Internet of Things (IoT) and machine learning. By integrating the 3D memory arrays on chip during the BEOL processing, issues such as energy consumption bottleneck due to off-chip memory access are avoided. As a result, semiconductor devices with the disclosed 3D memory devices integrated may be made smaller, cheaper, while operating at faster speed and consuming less power. Additional advantage may include reduced parasitic capacitance by the formation of the inner spacers.

Figure 16:
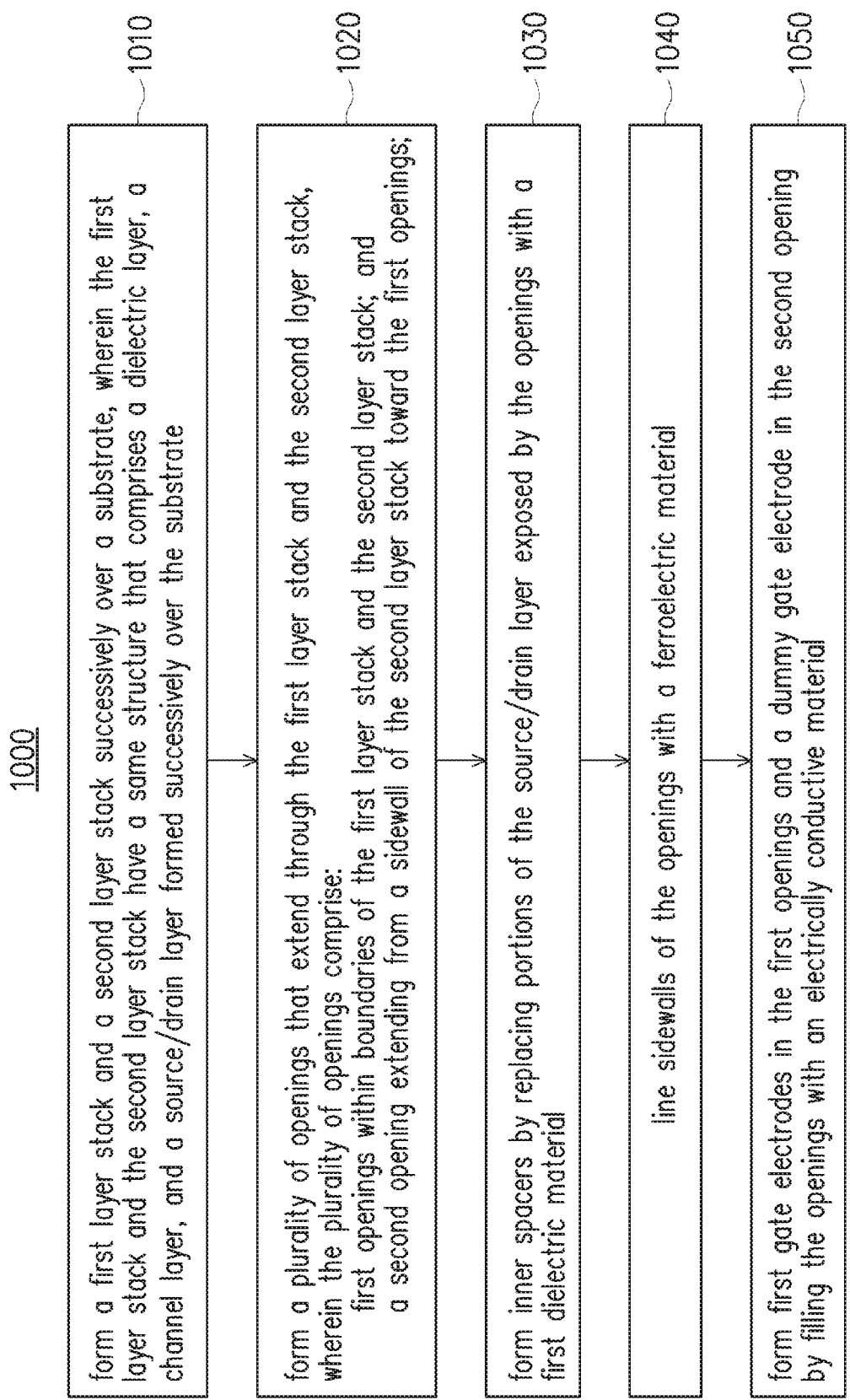
FIG. 16 illustrates a flow chart of a method of forming a memory device, in some embodiments.

FIG. 16 illustrates a flow chart of a method of forming a memory device, in some embodiments. It should be understood that the embodiment method shown in FIG. 16 is merely an example of many possible embodiment methods. One of ordinary skill in the art would recognize many variations, alternatives, and modifications. For example, various steps as illustrated in FIG. 16 may be added, removed, replaced, rearranged, or repeated.

Referring to FIG. 16, at block 1010, a first layer stack and a second layer stack are formed successively over a substrate, wherein the first layer stack and the second layer stack have a same structure that comprises a dielectric layer, a channel layer, and a source/drain layer formed successively over the substrate. At block 1020, a plurality of openings are formed that extend through the first layer stack and the second layer stack, wherein the plurality of openings comprise: first openings within boundaries of the first layer stack and the second layer stack; and a second opening extending from a sidewall of the second layer stack toward the first openings. At block 1030, inner spacers are formed by replacing portions of the source/drain layer exposed by the openings with a first dielectric material. At block 1040, sidewalls of the openings are lined with a ferroelectric material. At block 1050, first gate electrodes are formed in the first openings and a dummy gate electrode is formed in the second opening by filling the openings with an electrically conductive material.

In accordance with an embodiment, a method for forming a memory device includes: forming a first layer stack over a substrate, the first layer stack comprising a first dielectric layer, a first channel layer, and a first source/drain layer formed successively over the substrate; forming a second layer stack over the first layer stack, the second layer stack comprising a second dielectric layer, a second channel layer, and a second source/drain layer formed successively over the first layer stack; forming openings that extend through the first layer stack and the second layer stack, wherein first ones of the openings are encircled by the first layer stack, and a second one of the openings extends to a first sidewall of the first layer stack; replacing a first portion of the first source/drain layer and a second portion of the second source/drain layer exposed by the openings with a first dielectric material; after the replacing, lining sidewalls of the openings with a ferroelectric material; after lining the sidewalls of the openings, filling the openings with an electrically conductive material to form first gate electrodes in the first ones of the openings and to form a second gate electrode in the second one of the openings; after filling the openings, forming trenches and a recess that extend through the first layer stack and the second layer stack, wherein the trenches bisect the first gate electrodes, wherein forming the recess removes the second gate electrode and the ferroelectric material around the second gate electrode; and filling the trenches and the recess with a second dielectric material. In an embodiment, replacing the first portion of the first source/drain layer and the second portion of the second source/drain layer comprises: performing an etching process to remove the first portion of the first source/drain layer and the second portion of the second source/drain layer that are exposed by the openings; after performing the etching process, depositing the first dielectric material in the openings, wherein the first dielectric material lines the sidewalls and bottoms of the openings, and fills spaces left by the removed first portion of the first source/drain layer and by the removed second portion of the second source/drain layer; and performing an anisotropic etching process to remove the first dielectric material from the sidewalls and the bottoms of the openings. In an embodiment, after replacing the first portion of the first source/drain layer and the second portion of the second source/drain layer, the first dielectric material fills spaces between the first ones of the openings, separates the first source/drain layer into a first source/drain region and a second source/drain region spaced apart from the first source/drain region, and separates the second source/drain layer into a third source/drain region and a fourth source/drain region spaced apart from the third source/drain region. In an embodiment, the trenches are formed to further bisect the ferroelectric material around the first gate electrodes. In an embodiment, the recess is formed to extend from the first sidewall of the first layer stack toward the first gate electrodes, wherein sidewalls of the recess form a U-shape. In an embodiment, each of the first gate electrodes is electrically isolated by the second dielectric material into two separate second gate electrodes, wherein the method further comprises, after filling the trenches and the recess: forming gate contacts electrically coupled to the second gate electrodes; and forming source/drain contacts electrically coupled to the first source/drain layer and the second source/drain layer. In an embodiment, the gate contacts are formed over the second layer stack such that the second layer stack is between the gate contacts and the first layer stack. In an embodiment, the gate contacts are formed under the first layer stack such that the gate contacts are between the first layer stack and the substrate. In an embodiment, forming the source/drain contacts comprises: removing a portion of the second layer stack laterally distal from the second gate electrodes to expose an upper surface of the first source/drain layer of the first layer stack, wherein the first layer stack and the second layer stack form a staircase-shaped region after removing the portion of the second layer stack; and forming first source/drain contacts over and electrically coupled to the exposed upper surface of the first source/drain layer. In an embodiment, the method further includes forming a third dielectric layer over the second layer stack before forming the openings, wherein the openings are formed to extend through the third dielectric layer. In an embodiment, forming the source/drain contacts further comprises: removing a portion of the third dielectric layer laterally distal from the second gate electrodes to expose the second source/drain layer of the second layer stack; and forming second source/drain contacts over and electrically coupled to the exposed second source/drain layer. In an embodiment, the first source/drain layer and the second source/drain layer are formed of a first material, and the first channel layer and the second channel layer are formed of a second material. In an embodiment, the first material is a metal, and the second material is a semiconductive oxide.

In accordance with an embodiment, a method for forming a memory device includes: forming a first layer stack and a second layer stack successively over a substrate, wherein the first layer stack and the second layer stack have a same structure that comprises a dielectric layer, a channel layer, and a source/drain layer formed successively over the substrate; forming a plurality of openings that extend through the first layer stack and the second layer stack, wherein the plurality of openings comprise: first openings within boundaries of the first layer stack and the second layer stack; and a second opening extending from a sidewall of the second layer stack toward the first openings; forming inner spacers by replacing portions of the source/drain layer exposed by the openings with a first dielectric material; lining sidewalls of the openings with a ferroelectric material; and forming first gate electrodes in the first openings and a dummy gate electrode in the second opening by filling the openings with an electrically conductive material. In an embodiment, the method further includes, after forming the first gate electrodes and the dummy gate electrode: forming slot-shaped openings extending through the first layer stack and the second layer stack, the slot-shaped openings bisecting the first gate electrodes; forming a recess extending from the sidewall of the second layer stack toward the first gate electrodes, wherein the dummy gate electrode is removed after the recess is formed; and filling the slot-shaped openings and the recess with a second dielectric material. In an embodiment, each of the first gate electrodes is separated by the second dielectric material into two gate electrodes to form a plurality of second gate electrodes, wherein the method further comprising: forming gate contacts electrically coupled to the plurality of second gate electrodes; removing portions of the second layer stack to expose portions of the source/drain layer of the first layer stack; and after removing the portions of the second layer stack, forming source/drain contacts electrically coupled to the exposed portions of the source/drain layer of the first layer stack. In an embodiment, the channel layer is formed of an oxide semiconductor, and the source/drain layer is formed of a metal.

In accordance with an embodiment, a memory device includes: a layer stack over a substrate, wherein the layer stack comprises a dielectric layer, a channel layer over the dielectric layer, and a source/drain layer over the channel layer; a first gate electrode and a second gate electrode that extend through the layer stack; a dielectric material extending through the layer stack, wherein a first portion of the dielectric material is between the first gate electrode and the second gate electrode, a second portion of the dielectric material extends from a sidewall of the layer stack toward the first gate electrode and the second gate electrode, and the second portion of the dielectric material is spaced apart from the first portion of the dielectric material; a ferroelectric material extending through the layer stack, wherein the ferroelectric material extends along a sidewall of the first gate electrode and along a sidewall of the second gate electrode; and inner spacers disposed at a same distance from the substrate as the source/drain layer, wherein the inner spacers surround the first gate electrode, the second gate electrode, the dielectric material, and the ferroelectric material, wherein the inner spacers separate the source/drain layer into a first source/drain region and a second source/drain region spaced apart from the first source/drain region. In an embodiment, the memory device further includes: gate contacts electrically coupled to the first gate electrode and the second gate electrode; and source/drain contacts electrically coupled to the first source/drain region and the second source/drain region. In an embodiment, the channel layer comprises a semiconductive oxide, and the source/drain layer comprises a metal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a memory device, the method comprising:
    forming a first layer stack over a substrate, the first layer stack comprising a first dielectric layer, a first channel layer, and a first source/drain layer formed successively over the substrate;
    forming a second layer stack over the first layer stack, the second layer stack comprising a second dielectric layer, a second channel layer, and a second source/drain layer formed successively over the first layer stack;
    forming openings that extend through the first layer stack and the second layer stack, wherein first ones of the openings are encircled by the first layer stack, and a second one of the openings extends to a first sidewall of the first layer stack;
    replacing a first portion of the first source/drain layer and a second portion of the second source/drain layer exposed by the openings with a first dielectric material;
    after the replacing, lining sidewalls of the openings with a ferroelectric material;
    after lining the sidewalls of the openings, filling the openings with an electrically conductive material to form first gate electrodes in the first ones of the openings and to form a dummy gate electrode in the second one of the openings;
    after filling the openings, forming trenches and a recess that extend through the first layer stack and the second layer stack, wherein the trenches bisect the first gate electrodes, wherein forming the recess removes the dummy gate electrode and the ferroelectric material around the second dummy gate electrode; and
    filling the trenches and the recess with a second dielectric material.

2. The method of claim 1, wherein replacing the first portion of the first source/drain layer and the second portion of the second source/drain layer comprises:
    performing an etching process to remove the first portion of the first source/drain layer and the second portion of the second source/drain layer that are exposed by the openings;
    after performing the etching process, depositing the first dielectric material in the openings, wherein the first dielectric material lines the sidewalls and bottoms of the openings, and fills spaces left by the removed first portion of the first source/drain layer and by the removed second portion of the second source/drain layer; and
    performing an anisotropic etching process to remove the first dielectric material from the sidewalls and the bottoms of the openings.

3. The method of claim 1, wherein after replacing the first portion of the first source/drain layer and the second portion of the second source/drain layer, the first dielectric material fills spaces between the first ones of the openings, separates the first source/drain layer into a first source/drain region and a second source/drain region spaced apart from the first source/drain region, and separates the second source/drain layer into a third source/drain region and a fourth source/drain region spaced apart from the third source/drain region.

4. The method of claim 1, wherein the trenches are formed to further bisect the ferroelectric material around the first gate electrodes.

5. The method of claim 4, wherein the recess is formed to extend from the first sidewall of the first layer stack toward the first gate electrodes, wherein sidewalls of the recess form a U-shape.

6. The method of claim 1, wherein each of the first gate electrodes is electrically isolated by the second dielectric material into two separate second gate electrodes, wherein the method further comprises, after filling the trenches and the recess:
   forming gate contacts electrically coupled to the second gate electrodes; and
   forming source/drain contacts electrically coupled to the first source/drain layer and the second source/drain layer.

7. The method of claim 6, wherein the gate contacts are formed over the second layer stack such that the second layer stack is between the gate contacts and the first layer stack.

8. The method of claim 6, wherein the gate contacts are formed under the first layer stack such that the gate contacts are between the first layer stack and the substrate.

9. The method of claim 6, wherein forming the source/drain contacts comprises:
   removing a portion of the second layer stack laterally distal from the second gate electrodes to expose an upper surface of the first source/drain layer of the first layer stack, wherein the first layer stack and the second layer stack form a staircase-shaped region after removing the portion of the second layer stack; and
   forming first source/drain contacts over and electrically coupled to the exposed upper surface of the first source/drain layer.

10. The method of claim 9, further comprising forming a third dielectric layer over the second layer stack before forming the openings, wherein the openings are formed to extend through the third dielectric layer.

11. The method of claim 10, wherein forming the source/drain contacts further comprises:
   removing a portion of the third dielectric layer laterally distal from the second gate electrodes to expose the second source/drain layer of the second layer stack; and
   forming second source/drain contacts over and electrically coupled to the exposed second source/drain layer.

12. The method of claim 1, wherein the first source/drain layer and the second source/drain layer are formed of a first material, and the first channel layer and the second channel layer are formed of a second material.

13. The method of claim 12, wherein the first material is a metal, and the second material is a semiconductive oxide.

14. A method for forming a memory device, the method comprising:
   forming a first layer stack and a second layer stack successively over a substrate, wherein the first layer stack and the second layer stack have a same structure that comprises a dielectric layer, a channel layer, and a source/drain layer formed successively over the substrate;
   forming a plurality of openings that extend through the first layer stack and the second layer stack, wherein the plurality of openings comprise:
      first openings within boundaries of the first layer stack and the second layer stack; and
      a second opening extending from a sidewall of the second layer stack toward the first openings;
   forming inner spacers by replacing portions of the source/drain layer exposed by the openings with a first dielectric material;
   lining sidewalls of the openings with a ferroelectric material; and
   forming first gate electrodes in the first openings and a dummy gate electrode in the second opening by filling the openings with an electrically conductive material.

15. The method of claim 14, further comprising, after forming the first gate electrodes and the dummy gate electrode:
   forming slot-shaped openings extending through the first layer stack and the second layer stack, the slot-shaped openings bisecting the first gate electrodes;
   forming a recess extending from the sidewall of the second layer stack toward the first gate electrodes, wherein the dummy gate electrode is removed after the recess is formed; and
   filling the slot-shaped openings and the recess with a second dielectric material.

16. The method of claim 15, wherein each of the first gate electrodes is separated by the second dielectric material into two gate electrodes to form a plurality of second gate electrodes, wherein the method further comprising:
   forming gate contacts electrically coupled to the plurality of second gate electrodes;
   removing portions of the second layer stack to expose portions of the source/drain layer of the first layer stack; and
   after removing the portions of the second layer stack, forming source/drain contacts electrically coupled to the exposed portions of the source/drain layer of the first layer stack.

17. The method of claim 14, wherein the channel layer is formed of an oxide semiconductor, and the source/drain layer is formed of a metal.

18. A method for forming a memory device, the method comprising:
   forming a layer stack over a substrate, wherein the layer stack comprises a dielectric layer, a channel layer, and a source/drain layer formed successively over the substrate;
   forming first openings that extend through the layer stack;
   replacing portions of the source/drain layer exposed by the first openings with a first dielectric material, wherein the first dielectric material forms inner spacers and separates the source/drain layer into two separate portions;
   lining sidewalls of the first openings with a ferroelectric material; and
   forming first gate electrodes in the first openings by filling the first openings with a first electrically conductive material.

19. The method of claim 18, further comprising:
   forming a slot-shaped opening in each of the first gate electrodes, wherein the slot-shaped opening bisects each of the first gate electrodes into two separate gate electrodes and bisects the ferroelectric material; and
   filling the slot-shaped opening with a second electrically conductive material.

20. The method of claim 18, wherein the channel layer is formed of an oxide semiconductor, and the source/drain layer is formed of a metal.

\* \* \* \* \*

UNITED STATES PATENT AND TRADEMARK OFFICE
CERTIFICATE OF CORRECTION

PATENT NO. : 11,404,444 B2
APPLICATION NO. : 17/070619
DATED : August 2, 2022
INVENTOR(S) : Chun-Chieh Lu et al.

It is certified that error appears in the above-identified patent and that said Letters Patent is hereby corrected as shown below:

In the Claims

Claim 1, Column 16, Line 45; delete "the second dummy" and insert --the dummy--.

Signed and Sealed this
Sixth Day of September, 2022

*Katherine Kelly Vidal*

Katherine Kelly Vidal
*Director of the United States Patent and Trademark Office*